(12) United States Patent
Nakamura

(10) Patent No.: US 8,698,569 B2
(45) Date of Patent: Apr. 15, 2014

(54) MEMS RESONATOR

(75) Inventor: Kunihiko Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 119 days.

(21) Appl. No.: 13/522,781

(22) PCT Filed: Jan. 31, 2012

(86) PCT No.: PCT/JP2012/000616
§ 371 (c)(1),
(2), (4) Date: Jul. 18, 2012

(87) PCT Pub. No.: WO2012/114655
PCT Pub. Date: Aug. 30, 2012

(65) Prior Publication Data
US 2012/0319790 A1   Dec. 20, 2012

(30) Foreign Application Priority Data

Feb. 21, 2011  (JP) .................................. 2011-034402

(51) Int. Cl.
*H03B 5/30* (2006.01)
(52) U.S. Cl.
USPC ................. 331/154; 331/116 R; 331/116 FE; 331/158; 331/160
(58) Field of Classification Search
USPC ................. 331/116 R, 116 FE, 154, 158, 160
See application file for complete search history.

(56) References Cited

U.S. PATENT DOCUMENTS

| | | | |
|---|---|---|---|
| 4,616,186 A | 10/1986 | Jansen et al. | |
| 6,628,177 B2 | 9/2003 | Clark et al. | |
| 7,358,648 B2 | 4/2008 | Nakamura et al. | |
| 2007/0164839 A1 | 7/2007 | Naito | |
| 2007/0187834 A1 | 8/2007 | Minamio et al. | |
| 2007/0222541 A1 | 9/2007 | Naito | |
| 2011/0001582 A1 | 1/2011 | Nagasaki | |

FOREIGN PATENT DOCUMENTS

| | | |
|---|---|---|
| JP | 60-257608 | 12/1985 |
| JP | 2005-341536 | 12/2005 |
| JP | 2006-33813 | 2/2006 |
| JP | 2007-220822 | 8/2007 |
| JP | 2009-94690 | 4/2009 |
| JP | 2009-190150 | 8/2009 |

OTHER PUBLICATIONS

International Preliminary Report on Patentability issued Aug. 29, 2013 in corresponding International (PCT) Application No. PCT/JP2012/000616.
International Search Report issued Mar. 19, 2012 in International (PCT) Application No. PCT/JP2012/000616.
M. Lutz et al. "MEMS Oscillators for High Volume Commercial Applications", Transducers & Eurosensors '07, IEEE, pp. 49-52, 2007.

*Primary Examiner* — Joseph Chang
*Assistant Examiner* — Jeffrey Shin
(74) *Attorney, Agent, or Firm* — Wenderoth, Lind & Ponack, L.L.P.

(57) ABSTRACT

In order to provide a MEMS resonator having a higher Q factor, by suppressing losses in high-frequency signals due to barriers of thin-film lamination portions, in cases where there exist junction interfaces (barriers), such as pn junctions, in AC-current input/output lines for a vibrator (1) and electrodes (2, 3), the MEMS resonator is structured such that a DC current is flowed therethrough along with an AC current at the same time, in order to reduce resistance losses applied to the AC current, wherein there are provided DC bias circuits (22, 23, 24) for continuously flowing DC currents through the junction interfaces, in an input-electrode side and/or output-electrode side.

20 Claims, 18 Drawing Sheets

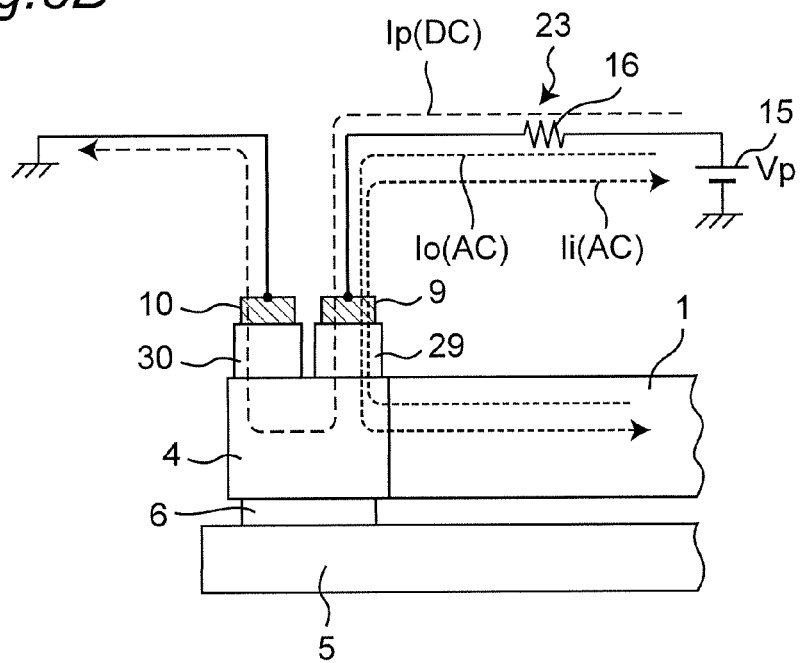
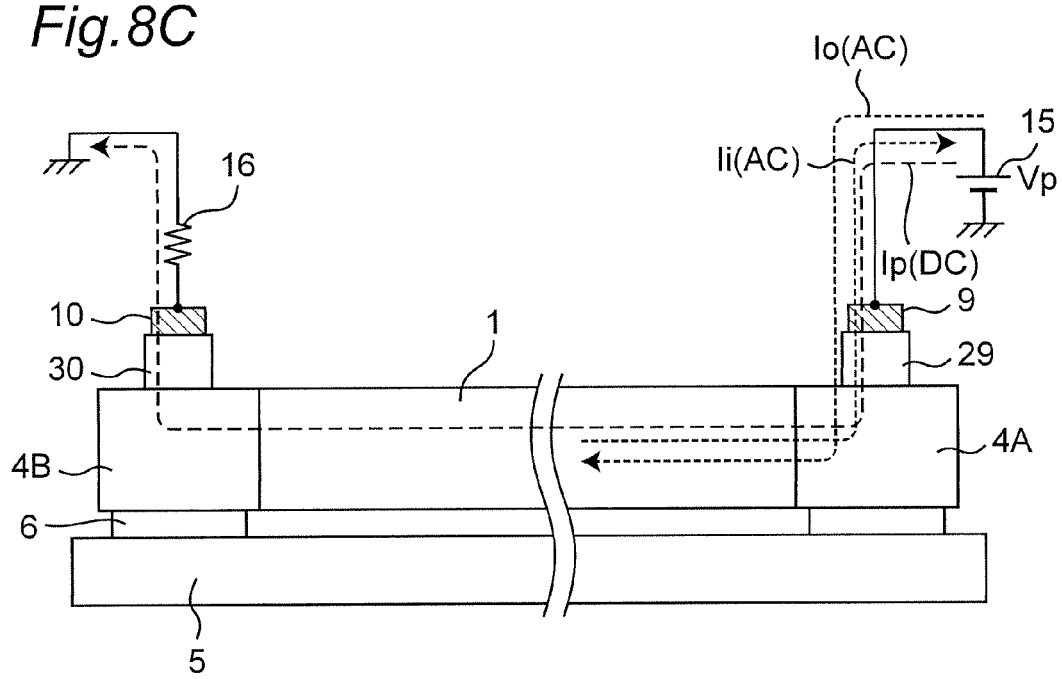

MEMS RESONATOR

TECHNICAL FIELD

The present invention relates to resonators which are used as timing devices in electronic apparatuses and the like and, more particularly, relates to MEMS (Micro-Electro Mechanical Systems) resonators.

BACKGROUND ART

A conventional MEMS resonator will be described, with reference to FIG. 16 and FIG. 17. FIG. 16 is a perspective view illustrating a conventional MEMS resonator 100 which is formed using an SOT (Silicon On Insulator) substrate. A beam-type vibrator 101, an input electrode 102 and an output electrode 103 have been formed by etching an uppermost Si layer in the SOI. The vibrator 101 which is supported at its opposite ends is formed by etching a portion of a BOX (Buried Oxide) layer, in a state where the vibrator 101 is allowed to vibrate. Through the remainder portion of the BOX layer, supporting portions 104 at the opposite ends of the vibrator 101, the input electrode 102 and the output electrode 103 are anchored to a silicon substrate 105, with an embedded oxide layer 110 interposed therebetween.

FIG. 17 is a view schematically illustrating a cross section of the conventional MEMS resonator illustrated in FIG. 16, taken along the line A-A. As illustrated in FIG. 17, the conventional MEMS resonator 100 is structured such that the electrodes 102 and 103 are placed to face the respective side surfaces of the vibrator 101 in the opposite sides, with gaps interposed therebetween. One of the electrodes is made to be the input electrode 102, while the other electrode is made to be the output electrode 103. As a concrete example, by applying a DC voltage Vp to the vibrator 101, it is possible to realize a structure which provides a DC electric-potential difference between the input electrode 102 and the vibrator 101 and, also, provides a DC electric-potential difference between the output electrode 103 and the vibrator 101.

In the MEMS resonator 100, if an AC voltage is applied to the input electrode 102, this induces a change of the electric-potential difference between the input electrode 102 and the vibrator 101, which causes an excitation force derived by an electrostatic force to be applied to the vibrator 101. When the frequency of the AC voltage applied to the input electrode 102 is coincident with the mechanical resonance frequency of the vibrator 101, the vibrator 101 is largely vibrated, which causes the output electrode 103 to output an electric current due to the displacement along with the vibration thereof. This is the principle of operations of the MEMS resonator 100.

The vibrator 101 illustrated in FIG. 16 has a both-ends-supported beam shape which is fixed at its opposite ends and is held in a midair state at its middle portion. If an electrostatic force is applied to the vibrator 101, this excites a flexural vibration mode in which the beam induces flexural vibrations therein. As a method for fabricating an MEMS resonator employing an SOI as described above, there has been a common method described in "Non-patent Literature 1" which will be described later, for example. Further, "Patent Literature 1", which will be described later, describes a vibrator having a disk shape. Resonance modes which can be excited in the vibrator include torsional vibration modes as described in "Patent Literature 2" which will be described later, in addition to flexural vibration modes, wherein such torsional vibration modes can be excited even when the vibrator has a beam shape.

CITATION LIST

Patent Literatures

Patent Literature 1: U.S. Pat. No. 6,628,177B2
Patent Literature 2: U.S. Pat. No. 7,358,648B2

Non Patent Literature

Non-patent Literature 1: M. Lutz, A. partridge, P. Gupta, N. Buchan, E. KLaassen, J. McDonald, K, Petersen, "MEMS OSCILLATORS FOR HIGH VOLUME COMMERCIAL APPLICATIONS", Transducers & Eurosensors '07, IEEE, pp. 49-52, 2007

SUMMARY OF INVENTION

Technical Problem

In order to cause mechanical resonances in the HF band, the VHF band and the UHF band which are used for oscillators in electric circuits, vibrators are made to have sizes of the order of micrometers or less and, therefore, are made to be fine. Further, in cases where a MEMS resonator is applied to a mass sensor and the like, since the minimum mass-detection ability is proportional to the −2.5-th power of the resonance frequency, it is preferable to employ a vibrator having a higher mechanical resonance frequency for detecting small quantities of masses, namely it is preferable to employ a vibrator having a size of the order of micrometers or less and, thus, a fine vibrator is suitable therefor.

As a method for fabricating a resonator using such a fine vibrator, there has been a common method which forms a resonator on a silicon substrate through semiconductor processing, as the resonators described in "Non-patent Literature 1", "Patent Literature 1", and "Non-patent Literature 2" which have been described above. Accordingly, semiconductor materials (including silicides) have been employed as the materials of vibrators and electrodes.

FIG. 17 schematically illustrates a conventional MEMS resonator for describing operations thereof. In actual, in cases where the MEMS resonator is formed on a semiconductor substrate, the resonator has a structure as illustrated in cross-sectional views in FIG. 18 and FIG. 19, as an example of a resonator cross-sectional structure. FIG. 18 schematically illustrates a cross section of the MEMS resonator 100 illustrated in FIG. 16, taken along the line A-A, and FIG. 19 schematically illustrates a cross section of the MEMS resonator 100 illustrated in FIG. 16, taken along the line B-B. Further, in FIG. 19, there are illustrated one end portion of the vibrator 101 (the supporting portion 104) and the vicinity thereof. Further, in the present specification, for example, the cross section of the MEMS resonator 100 illustrated in FIG. 16 taken along the line A-A refers to the cross section of the MEMS resonator 100 illustrated in FIG. 16 taken along a vertical plane including the line A-A.

In the conventional MEMS resonator 100 illustrated in FIG. 18 and FIG. 19, the vibrator 101, the input electrode 102 and the output electrode 103 are all formed from an n-type semiconductor. Metal layers 106, 107 and 108 are formed on the input electrode 102, the output electrode 103 and the supporting portion 104, respectively. An AC voltage Vi (AC) is inputted to the input electrode 102, while an AC current Io (AC) is outputted from the output electrode 103. Further, a bias DC voltage Vp is applied to the vibrator 101 through the supporting portion 104. In these electric paths, there exist the junction interfaces where the metal layers 106, 107 and 108 and the n-type semiconductors 102, 103 and 104 are bonded to each other, and these junction interfaces form barriers as will be described later.

Further, in the MEMS resonator, in addition to the junction interfaces between the metal layers and the n-type semiconductors (metal-n junctions) illustrated in FIG. 18 and FIG. 19, there may exist junctions between metal layers and p-type semiconductors (metal-p junctions), pn junctions, pnp junctions and npn junctions. These junction interfaces also form barriers.

Hereinafter, there will be described problems induced by the formation of junction interfaces as described above. FIG. 20 is a graph illustrating an example of a V-I characteristic at a junction interface between a metal layer and a p-type semiconductor. In FIG. 20, the lateral axis represents the electric-potential difference (V) between the opposite sides of the junction interface, while the vertical axis represents the DC current (I) which passes through the junction interface.

As illustrated in FIG. 20, when the electric-potential difference (V) between the opposite sides of the junction interface is V=0, the DC current (I) passing through the junction interface is I=0. If an electric-potential difference (V) is induced therebetween, a DC current flows therethrough, and the V-I characteristic relationship is not linear.

In a flexural vibration mode in the MEMS resonator 100 illustrated in FIG. 17, no DC current flows between the input electrode 102 and the output electrode 103. The input electrode 102 and the vibrator 101 are placed to face each other with a gap interposed therebetween, and a capacitor having a capacitance Ci is formed between the input electrode 102 and the vibrator 101. Similarly, the output electrode 103 and the vibrator 101 are placed to face each other with a gap interposed therebetween, and a capacitor having a capacitance Co is formed between the output electrode 103 and the vibrator 101. Therefore, the capacitor (Ci) between the vibrator 101 and the input electrode 102, and the capacitor (Co) between the vibrator 101 and the output electrode 103 interrupt the DC current between the input electrode 102 and the output electrode 103. For the same reason, a DC current induced by the DC power supply Vp is not flowed through the vibrator 101 through the supporting portion 104.

Accordingly, only AC signals flow through the input electrode 102, the vibrator 101 and the output electrode 103. AC signals passing through the junction interfaces through which no DC current flows are subjected to a resistance which corresponds to the inverse (r) of the gradient of the characteristic curve of the V-I characteristic illustrated in FIG. 20, at V=0. This resistance r induces electric energy losses in the MEMS resonator.

FIG. 21 is a circuit diagram illustrating an ideal equivalent circuit of the MEMS resonator in FIG. 17. In the equivalent circuit in FIG. 21, the capacitance Ci and the capacitance Co are defined as C, assuming that they have the same value. Further, "m" is the mass of the vibrator 101, "k" is the spring force of the vibrator 101, and "Qm" is the Q factor of mechanical vibrations thereof. In FIG. 21, elements within a broken line indicate a mechanical spring-mass-damper resonance system. Vp is the bias DC voltage applied to the vibrator 101. Further, "η" is an electro-mechanical conversion coefficient, which is the value of the change $\Delta C/\Delta x$ of the capacitance C between the vibrator 101 and the electrodes due to a unit amount $\Delta x$ of displacement of the vibrator 101, which is multiplied by the bias DC voltage Vp. "Zp" is the internal impedance of the power supply for supplying the bias DC voltage Vp.

FIG. 22 is a circuit diagram illustrating an equivalent circuit of the MEMS resonator, in a case where there exist a resistance ri in the input side, a resistance ro in the output side, and a resistance rb in the bias-DC-voltage supply path for the vibrator 101, due to barriers existing in the actual device of the MEMS resonator. Referring to FIG. 22, the Q factor of the entire electric device is Qe, which is not coincident with the Q factor (Qm) of inherent mechanical vibrations, due to the presence of the electric resistance losses due to the barriers and, therefore, Qe is lower than Qm. A resonator having a higher Q factor can improve a minimum-detection ability when it is applied to a mass detector, for example. Further, such a resonator having a higher Q factor can reduce phase noise when it is applied to as an oscillator, for example. Therefore, in order to realize higher-performance devices employing various types of resonators, it is necessary to minimize degradations of Q factors due to resistance losses.

The present invention was made in view of the aforementioned circumstances and aims at providing an MEMS resonator capable of suppressing degradation of the Q factor due to unnecessary resistances, in order to maximize the utilization of the Q factor relating to mechanical vibrations of the MEMS resonator.

Solution to Problem

The present inventors have conducted various types of experiments in order to overcome the aforementioned problems. As a result thereof, it has been revealed that, in cases where there exist junction interfaces (barriers) such as pn junctions in AC-current input/output lines for a vibrator and electrodes, in an MEMS resonator, it is possible to reduce losses due to resistances applied to AC currents, by flowing DC currents along with the AC currents.

In a first aspect of the present invention, there is provided an MEMS resonator including: a vibrator adapted to mechanically vibrate by being subjected to an electrostatic force; a supporting portion adapted to support the vibrator so as to allow the vibrator to vibrate; and at least a single electrode having a surface which faces the vibrator with a gap interposed therebetween; one of the supporting portion and the electrode being an input electrode, and the other one of the supporting portion and the electrode being an output electrode, the vibrator being adapted to be excited by an electrostatic force induced by an AC signal applied to the input electrode through an input terminal connected to the input electrode, so that an electric current induced by the vibration of the vibrator is outputted from the output electrode through an output terminal connected to the output electrode, wherein there is formed a junction interface having at least one of a pn junction, a pp junction, an nn junction, a metal-n junction, and a metal-p junction, in an electric-current path between the input terminal and the input electrode or in an electric-current path between the output electrode and the output terminal, and there is provided a DC bias circuit for continuously flowing a DC current through the junction interface. With the MEMS resonator having the aforementioned structure in the first aspect of the present invention, it is possible to suppress losses due to electrical resistances which are unnecessarily induced in the MEMS resonator, thereby realizing a resonator having a higher Q factor comparable to a mechanical Q factor.

In a second aspect of the present invention, there is provided an MEMS resonator including: a vibrator adapted to mechanically vibrate by being subjected to an electrostatic force; a supporting portion adapted to support the vibrator in such a way as to allow the vibrator to vibrate; and at least two electrodes having a surface which faces the vibrator with a gap interposed therebetween; one of the at least two electrodes being an input electrode, and the other one of the at least two electrodes being an output electrode, the vibrator being adapted to be excited by an electrostatic force induced by an AC signal applied to the input electrode through an input terminal connected to the input electrode, so that an electric current induced by the vibration of the vibrator is outputted from the output electrode through an output terminal connected to the output electrode, wherein a bias terminal is connected to the supporting portion which is formed integrally with the vibrator, there is formed a junction interface having at least one of a pn junction, a pp junction, an nn junction, a metal-n junction, and a metal-p junction, in an electric-current path between the bias terminal and the supporting portion, and there is provided a DC bias circuit for continuously flowing a DC current through the junction interface. With the MEMS resonator having the aforementioned structure in the second aspect of the present invention, it is possible to suppress losses due to electrical resistances which are unnecessarily induced in the MEMS resonator, thereby realizing a resonator having a higher Q factor comparable to a mechanical Q factor.

In a third aspect of the present invention, the MEMS resonator in the aforementioned first aspect may include a first intermediate layer placed on a surface of the input electrode, wherein the junction interface may be formed between the input electrode and the first intermediate layer, the input terminal may be connected to the input electrode through the first intermediate layer, the DC bias circuit may include a first impedance device which is connected at its one end to one of a DC power supply and a common electrode and, further, is connected to the first intermediate layer at the other end thereof, and a second impedance device which is connected at its one end to the surface of the input electrode in an area thereof other than the area in which the first intermediate layer is formed and, further, is connected at its other end to the other one of the DC power supply and the common electrode, the first impedance device may have an inductor or a resistance, the second impedance device may have an inductor or a resistance, and one of the first impedance device and the second impedance device may have a resistance. With the MEMS resonator having the aforementioned structure in the third aspect of the present invention, in cases where there exists a junction interface (barrier) in an AC-current input/output line for the input electrode, it is possible to flow a DC current therethrough along with an AC current at the same time, thereby reducing resistance losses applied to the AC current.

In a fourth aspect of the present invention, the MEMS resonator in the aforementioned third aspect may include a second intermediate layer which is placed on the surface of the input electrode and is spaced apart from the first intermediate layer, wherein the second impedance device may be connected to the input electrode through the second intermediate layer. With the MEMS resonator having the aforementioned structure in the fourth aspect of the present invention, it is possible to flow a DC current along with an AC current at the same time, thereby reducing resistance losses applied to the AC current.

In a fifth aspect of the present invention, the MEMS resonator in the aforementioned first aspect may include a first intermediate layer placed on a surface of the output electrode, wherein the junction interface may be formed between the output electrode and the first intermediate layer, the output terminal may be connected to the output electrode through the first intermediate layer, the DC bias circuit may include a first impedance device which is connected at its one end to one of a DC power supply and a common electrode and, further, is connected to the first intermediate layer at the other end thereof, and a second impedance device which is connected at its one end to the surface of the output electrode in an area thereof other than the area in which the first intermediate layer is formed and, further, is connected at its other end to the other one of the DC power supply and the common electrode, the first impedance device may have an inductor or a resistance, the second impedance device may have an inductor or a resistance, and one of the first impedance device and the second impedance device may have a resistance. With the MEMS resonator having the aforementioned structure in the fifth aspect of the present invention, in cases where there exists a junction interface (barrier) in an AC-current input/output line for the output electrode, it is possible to flow a DC current therethrough along with an AC current at the same time, thereby reducing resistance losses applied to the AC current.

In a sixth aspect of the present invention, the MEMS resonator in the aforementioned fifth aspect may include a second intermediate layer which is placed on the surface of the output electrode and is spaced apart from the first intermediate layer, wherein the second impedance device may be connected to the output electrode through the second intermediate layer. With the MEMS resonator having the aforementioned structure in the sixth aspect of the present invention, it is possible to flow a DC current therethrough an AC current at the same time, thereby reducing resistance losses applied to the AC current.

In a seventh aspect of the present invention, the MEMS resonator in the aforementioned second aspect may include a first intermediate layer placed on a surface of the supporting portion, wherein the junction interface may be formed between the supporting portion and the first intermediate layer, the bias terminal may be connected to the supporting portion through the first intermediate layer, through first wiring, the DC bias circuit may include second wiring which connects a common electrode to the surface of the supporting portion in an area thereof other than the area in which the first intermediate layer is formed, and one of the first wiring and the second wiring may include a resistance device, halfway therethrough. With the MEMS resonator having the aforementioned structure in the seventh aspect of the present invention, in cases where there exists a junction interface (barrier) in an AC-current input/output line for the supporting portion, it is possible to flow a DC current therethrough along with an AC current at the same time, thereby reducing resistance losses applied to the AC current.

In an eighth aspect of the present invention, in the MEMS resonator in the aforementioned second aspect, the supporting portion may include a first supporting portion and a second supporting portion which are adapted to support opposite ends of the vibrator, there may be provided a first intermediate layer which is placed on a surface of the first supporting portion, the junction interface may be formed between the first supporting portion and the first intermediate layer, the bias terminal may be connected to the first supporting portion through the first intermediate layer, through first wiring, and the DC bias circuit may include second wiring which connects a common electrode to the second supporting portion. With the MEMS resonator having the aforementioned structure in the eighth aspect of the present invention, in cases where there exists a junction interface (barrier) in an AC-current input/output line for the supporting portion, it is possible to flow a DC current therethrough along with an AC current at the same time, thereby reducing resistance losses applied to the AC current.

In a ninth aspect of the present invention, the MEMS resonator in the aforementioned seventh or eighth aspect may include a second intermediate layer which is placed on a surface of the second supporting portion and is spaced apart from the first intermediate layer with the vibrator interposed therebetween, wherein the second wiring may connect the second supporting portion to the common electrode through the second intermediate layer. With the MEMS resonator having the aforementioned structure in the ninth aspect of the present invention, since the first intermediate layer and the second intermediate layer are connected to each other with the vibrator interposed therebetween, it is possible to cause the vibrator to serve as an impedance device, thereby reducing resistance losses applied to the AC current with a reduced number of components.

In a tenth aspect of the present invention, in the MEMS resonator in any of the aforementioned third to sixth aspects, the first impedance device or the second impedance device may be made to have an impedance value set such that an electric current of an AC signal inputted to the input terminal is prevented from flowing through the DC power supply or the common electrode. With the MEMS resonator having the aforementioned structure in the tenth aspect of the present invention, it is possible to flow a DC current therethrough along with an AC current, at the same time.

In an eleventh aspect of the present invention, in the MEMS resonator in the aforementioned third or fifth aspect, the first intermediate layer may be formed to include a metal layer.

In a twelfth aspect of the present invention, in the MEMS resonator in the aforementioned fourth or sixth aspect, the second intermediate layer may be formed to include a metal layer.

In a thirteenth aspect of the present invention, in the MEMS resonator in the aforementioned third or fifth aspect, the first intermediate layer may be formed to include a metal layer and a mediation layer which are laminated.

In a fourteenth aspect of the present invention, in the MEMS resonator in the aforementioned fourth or sixth aspect, the first intermediate layer may be formed to include a metal layer and a mediation layer which are laminated.

Advantageous Effects of Invention

With the present invention, it is possible to suppress losses in AC signals due to the resistances of barriers which exist at the metal/semiconductor-layer junction interfaces in the MEMS resonator, thereby realizing a resonator having a higher Q factor comparable to a mechanical Q factor.

BRIEF DESCRIPTION OF DRAWINGS

FIG. 8B is a cross-sectional view schematically illustrating an end portion of a vibrator and the vicinity thereof (including a supporting portion) in a MEMS resonator having another structure according to the second embodiment.

FIG. 8C is a cross-sectional view schematically illustrating an end portion of a vibrator and the vicinity thereof (including a supporting portion) in a MEMS resonator having another structure according to the second embodiment.

DESCRIPTION OF EMBODIMENTS

Figure 1:
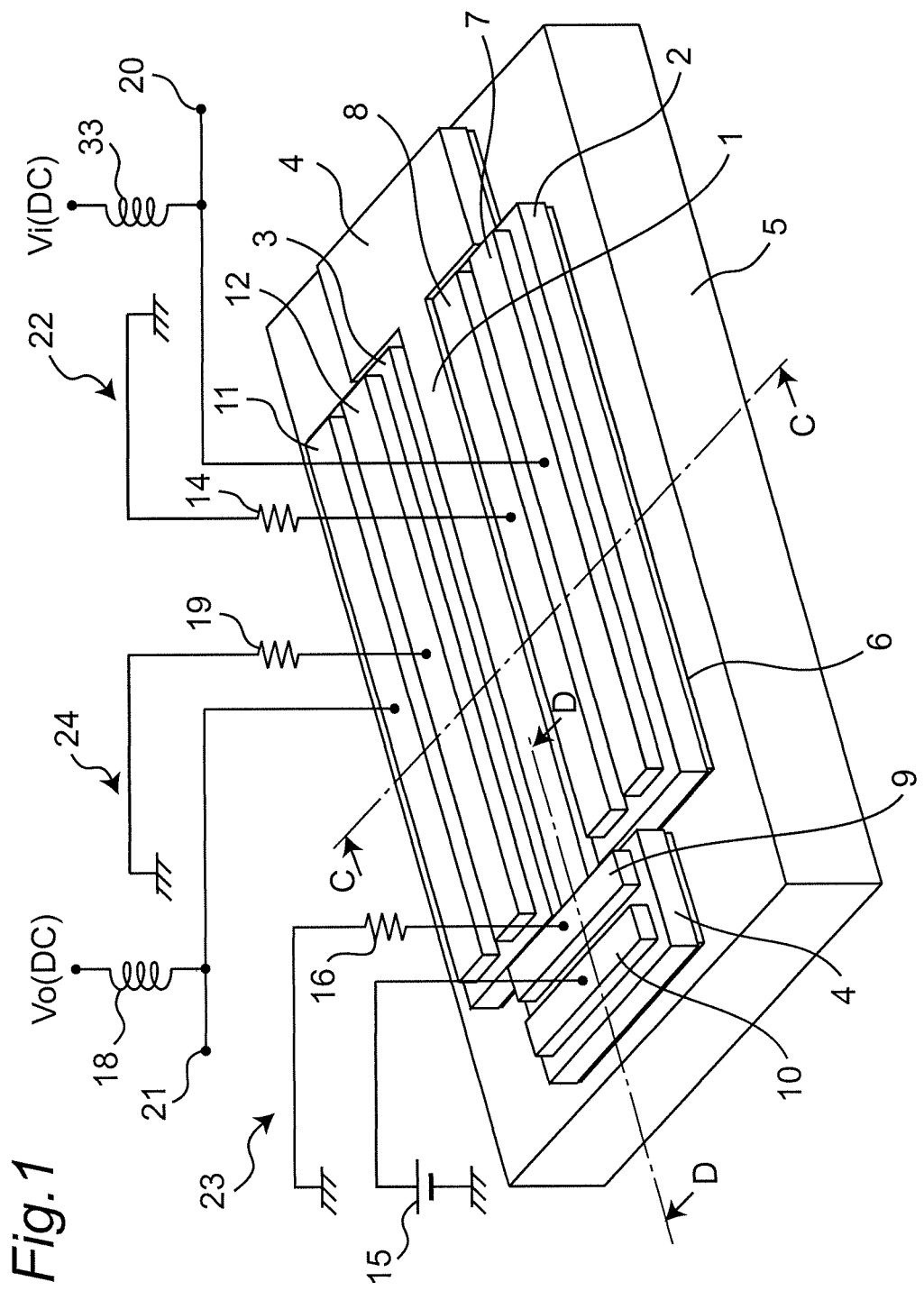
FIG. 1 is a perspective view illustrating a basic structure of a MEMS resonator according to a first embodiment of the present invention.

Hereinafter, with reference to the accompanying drawings, there will be described resonators having both-ends-supported beam shapes as embodiments of an MEMS resonator according to the present invention. Further, the resonator according to the present invention is not limited to the resonators having the structures which will be described in the following embodiments and is intended to include MEMS resonators structured based on technical concepts equivalent to the technical concepts which will be described in the following embodiments and based on technical common senses in the present technical field. Further, in the drawings for describing the present invention, thicknesses, sizes and shapes are exaggeratedly illustrated, in order to illustrate the structures of the MEMS resonators, which are fine mechanisms.

First Embodiment

Figure 2:
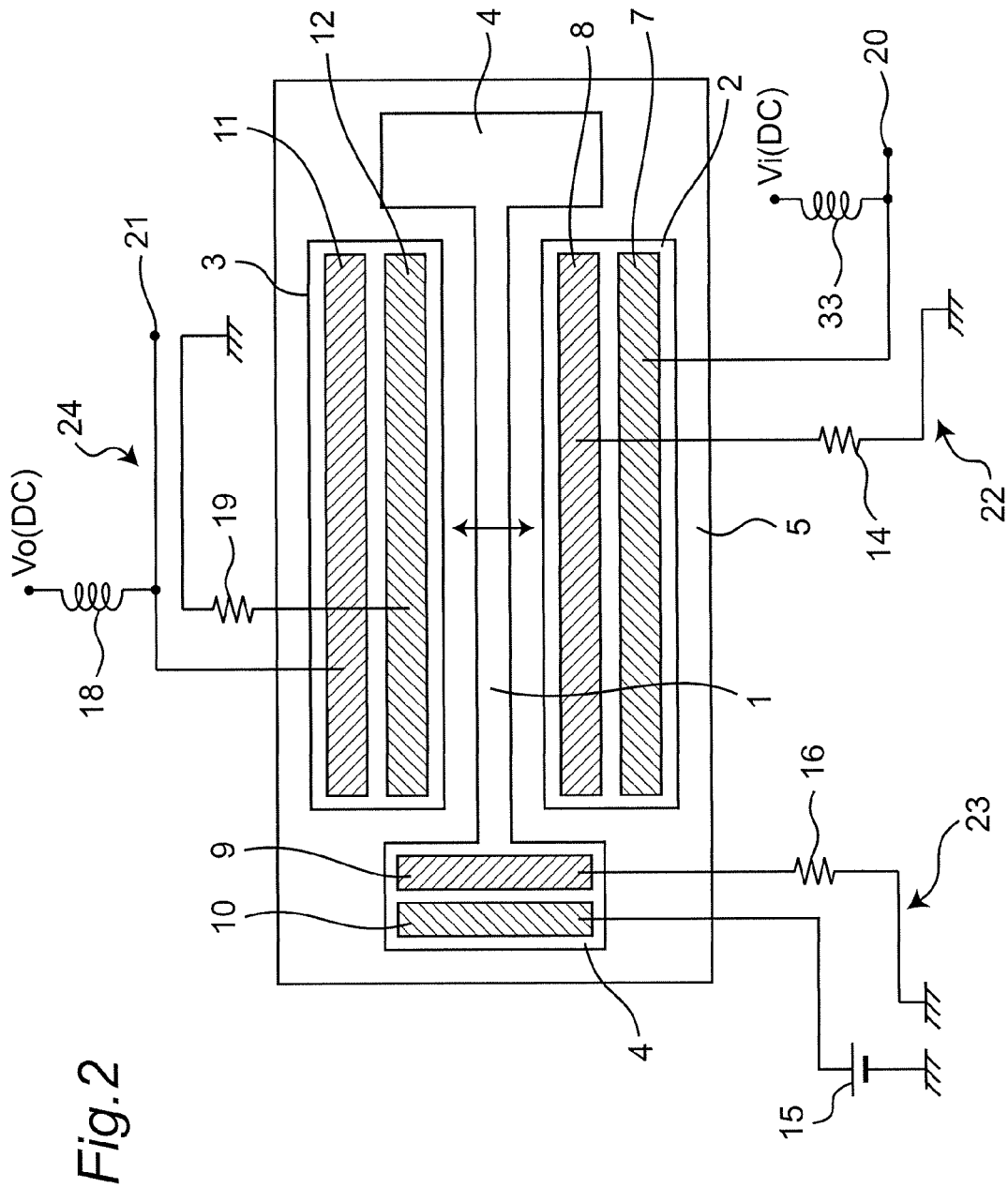
FIG. 2 is a plan view of the MEMS resonator according to the first embodiment illustrated in FIG. 1.
Figure 3:
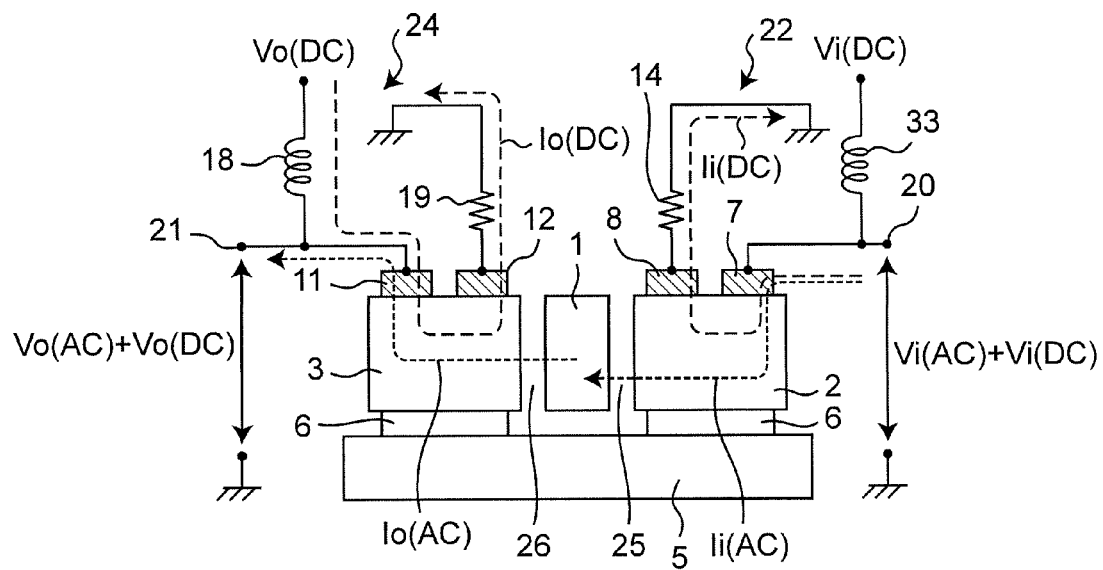
FIG. 3 is a cross-sectional view schematically illustrating the MEMS resonator according to the first embodiment for describing operations thereof.
Figure 4:
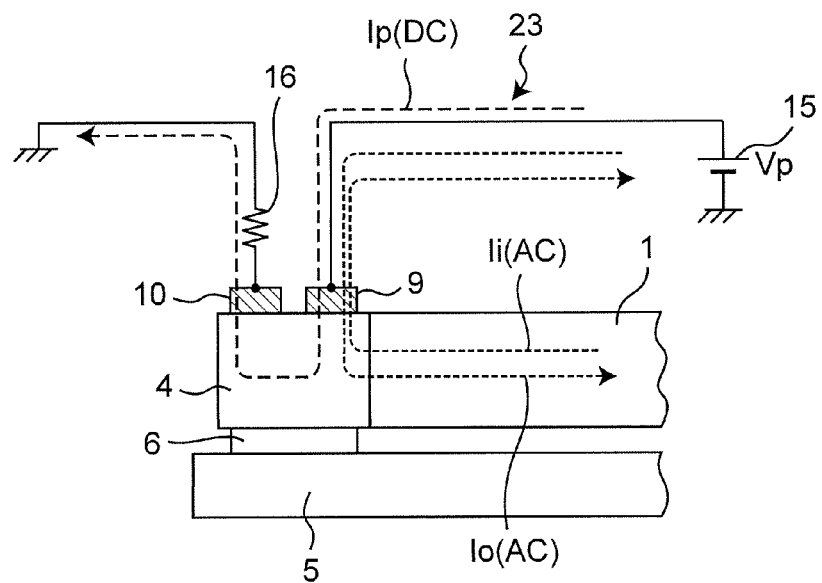
FIG. 4 is a cross-sectional view schematically illustrating the MEMS resonator according to the first embodiment for describing operations thereof.

FIG. 1 is a perspective view illustrating a basic structure of an MEMS resonator according to a first embodiment of the present invention. FIG. 2 is a plan view of the MEMS resonator according to the first embodiment illustrated in FIG. 1. FIG. 3 and FIG. 4 are cross-sectional views schematically illustrating the MEMS resonator according to the first embodiment for describing operations thereof, wherein FIG. 3 illustrates a cross section of the MEMS resonator in FIG. 1, taken along the line C-C, and FIG. 4 illustrates a cross section of the MEMS resonator in FIG. 1, taken along the line D-D. Further, in FIG. 4, there are illustrated one end portion of a vibrator and the vicinity thereof.

The MEMS resonator according to the first embodiment is formed using an SOI (Silicon On Insulator) substrate, wherein a beam-type vibrator 1, and an input electrode 2 and an output electrode 3 which are placed to face the vibrator 1 are formed by etching an uppermost Si layer in the SOI substrate. The vibrator 1 is formed to have a both-ends-supported beam shape, by etching a portion of a BOX (Buried Oxide) layer. Namely, the vibrator 1 is supported at its opposite ends by supporting portions 4, in a state where the vibrator 1 is allowed to perform flexural vibrations. Through the remainder portion of the BOX layer, the input electrode 2, the output electrode 3, and the supporting portions 4 at the opposite ends of the vibrator 1 are anchored to a silicon substrate 5, with an embedded oxide layer 6 interposed therebetween.

In the MEMS resonator according to the first embodiment, the input electrode 2 and the output electrode 3 are placed to face the opposite side surfaces of the vibrator 1 with gaps interposed therebetween. By applying a DC voltage Vp to the vibrator 1, a DC electric-potential difference is induced between the input electrode 2 and the vibrator 1, and between the output electrode 3 and the vibrator 1.

In the MEMS resonator according to the first embodiment, the vibrator 1, the input electrode 2 and the output electrode 3 are all made of an n-type semiconductor. The input electrode 2, the output electrode 3 and a supporting portion 4 of the vibrator 1 are each provided with two metal layers. On the surface of the input electrode 2, there are placed a first input-side metal layer 7 and a second input-side metal layer 8 such that they are spaced apart from each other. Further, on the surface of the output electrode 3, there are placed a first output-side metal layer 11 and a second output-side metal layer 12 such that they are spaced apart from each other. Further, on the surface of one of the supporting portions 4 at the opposite end portions of the vibrator 1, there are placed a first support-side metal layer 9 and a second support-side metal layer 10 such that they are spaced apart from each other.

In the structure according to the first embodiment, the first input-side metal layer 7 and the second input-side metal layer 8 form respective intermediate layers which are placed on the surface of the input electrode 2, the first output-side metal layer 11 and the second output-side metal layer 12 form respective intermediate layers which are placed on the surface of the output electrode 3, and the first support-side metal layer 9 and the second support-side metal layer 10 form respective intermediate layers which are placed on the surface of the supporting portion 4.

In the MEMS resonator, if an AC voltage is applied to the input electrode 2, this changes the electric-potential difference between the input electrode 2 and the vibrator 1, thereby causing the vibrator 1 to vibrate. When the frequency of the AC voltage applied to the input electrode 2 is coincident with the mechanical resonance frequency of the vibrator 1, the vibrator 1 is largely vibrated, which causes the output electrode 3 to output an electric current due to the displacement along with the vibration thereof.

As illustrated in FIG. 3, in the MEMS resonator according to the first embodiment, an AC voltage Vi (AC) is inputted thereto, through an input terminal 20 and through the first input-side metal layer 7 and the input electrode 2, while an AC current Io (AC) is outputted from an output terminal 21 through the output electrode 3 and the second output-side metal layer 11. Further, a bias DC voltage Vp is applied to the vibrator 1 through the supporting portion 4.

As described above, in the MEMS resonator according to the first embodiment, in the electric-signal path from the input terminal 20 to the output terminal 21, there are interposed the barriers of the junction interfaces where the n-type semiconductors and the metal layers are bonded to each other, and there are electric connections at these junction interfaces.

The MEMS resonator according to the first embodiment is structured such that DC currents are passed through the junction interfaces between the metal layers and the n-type semiconductors, and these DC currents flow to a common electric-potential source through DC bias circuits. In this case, the DC bias circuits are circuits for releasing only the injected DC currents, without passing AC signals therethrough and, further, are constituted by the common electric-potential source and a device having a higher impedance with respect to AC signals within a frequency range around the resonance frequency of the vibrator 1. More specifically, for example, it is possible to employ, therein, a coil device or resistance device which is grounded at its one end. For example, in cases where the MEMS resonator has an impedance of 10 k*ohms for AC signals, the coil devices or the resistance devices in the DC bias circuits is set to have an impedance value of 100 k*ohms or more, thereby preventing AC signals from flowing through the DC bias circuits.

There will be described roles of a bypass resistance 14 as an impedance device in the DC bias circuit 22 which is provided in the signal-input side, with reference to FIG. 3. An AC voltage Vi (AC) as an AC signal is applied to the input terminal 20. Further, a DC voltage Vi (DC) from a DC power supply is applied, through a coil 33, to the first input-side metal layer 7, to which the input terminal 20 is connected. Accordingly, the voltage formed from the DC voltage Vi (DC) and the AC voltage Vi (AC) which are superimposed on each other is applied to the first input-side metal layer 7. At this time, an AC current Ii (AC) passes through the first input-side metal layer 7 and the input electrode 2 (n type) and, further, flows to the vibrator 1 (n-type), through the capacitance (Ci) of an input-side facing portion 25. In this case, the input-side facing portion 25 is a capacitance portion which is constituted by the surfaces of the input electrode 2 and the vibrator 1 which are faced to each other.

Further, as illustrated in FIG. 4, the AC current Ii (AC) passes from the vibrator 1 through the supporting portion 4 and, further, flows into the ground electric potential which forms the common electric-potential source, through the first support-side metal layer 9. In the supporting portion 4 illustrated in FIG. 4, the AC current Ii (AC) flows in the direction to the bias power supply 15 having a lower internal-resistance value than that of a support-side bypass resistance 16.

Further, in the DC bias circuit 22 in the input-side, which is illustrated in FIG. 3, a DC current Ii (DC) induced by the DC voltage Vi (DC) passes through the first input-side metal layer 7 and the input electrode 2 (n type), further passes through the second input-side metal layer 8 and flows to the ground electric potential as the common electric-potential source, through the bypass resistance 14. The value of the bypass resistance 14 in the input side is set to be larger than that of the impedance of the capacitance (Ci) of the input-side facing portion 25. Therefore, the amount of the electric current flowed through the bypass resistance 14, out of the AC current Ii (AC), is negligible.

On the other hand, in a DC bias circuit 24 in the output side, which is illustrated in FIG. 3, a DC voltage Vo (DC) is applied to the first output-side metal layer 11 which is connected to the output terminal 21. The DC voltage Vo (DC) is applied thereto through a coil 18 having a higher impedance with respect to frequencies of AC signals to be flowed through the MEMS resonator. A DC current Io (DC) induced by the DC voltage Vo (DC) passes through the first output-side metal layer 11, the output electrode 3 (n type) and the second output-side metal layer 12 and, further, flows to the ground electric potential as the common electric-potential source, through a bypass resistance 19.

When the vibrator 1 is vibrated, the capacitance (Co) of an output-side facing portion 26 is changed, thereby inducing an output AC current Io (AC). The output AC current Io (AC) flows from the ground electric potential illustrated in FIG. 4, through the first support-side metal layer 9 and the supporting portion 4, to the vibrator 1. Here, the output-side facing portion 26 is a capacitance portion which is constituted by the surfaces of the vibrator 1 and the output electrode 3 which are faced to each other. The output AC current Io (AC) is outputted along the electric-signal path from the vibrator 1 illustrated in FIG. 3, through the capacitance (Co) of the output-side facing portion 26, the output electrode 3 and the first output-side metal layer 11 to the output terminal 21.

As illustrated in FIG. 4, in a DC bias circuit 23 in the support side, the bias voltage Vp from the bias power supply 15 is applied to the first support-side metal layer 9. Therefore, a DC current Ip (DC) induced by the bias voltage Vp passes through the first support-side metal layer 9 and the supporting portion 4 and, further, flows to the ground electric potential as the common electric-potential source, through the second support-side metal layer 10 and the bypass resistance 16. Further, in the first embodiment, the first support-side metal layer 9 is connected to the bias power supply 15 through a bias terminal.

With the structure illustrated in FIG. 3, when the input AC current Ii (AC) passes through the junction interface between the first input-side metal layer 7 and the input electrode 2, the DC current Ii (DC) flows therethrough at the same time. Similarly, when the output AC current Io (AC) passes through the junction interface between the output electrode 3 and the first output-side metal layer 11, the DC current Io (DC) flows therethrough at the same time.

Further, with the structure illustrated in FIG. 4, when the input AC current Ii (AC) and the output AC current Io (AC) pass through the junction interface between the first input-side metal layer 9 and the supporting portion 4, the DC current Ip (DC) flows therethrough at the same time. Namely, the DC current is superimposed on the AC current, at each of the metal-semiconductor junction interfaces. As a result thereof, as represented by the aforementioned V-I characteristic curve illustrated in FIG. 20, an operating point can be moved, which enables reducing the load resistance applied to the AC current (for example, the resistance r→the resistance r' in FIG. 20, wherein r'<r), thereby reducing the resistance value in comparison with the resistance r of when no DC current is flowed therethrough. This can largely reduce the electric energy loss in the AC current.

Figure 5:
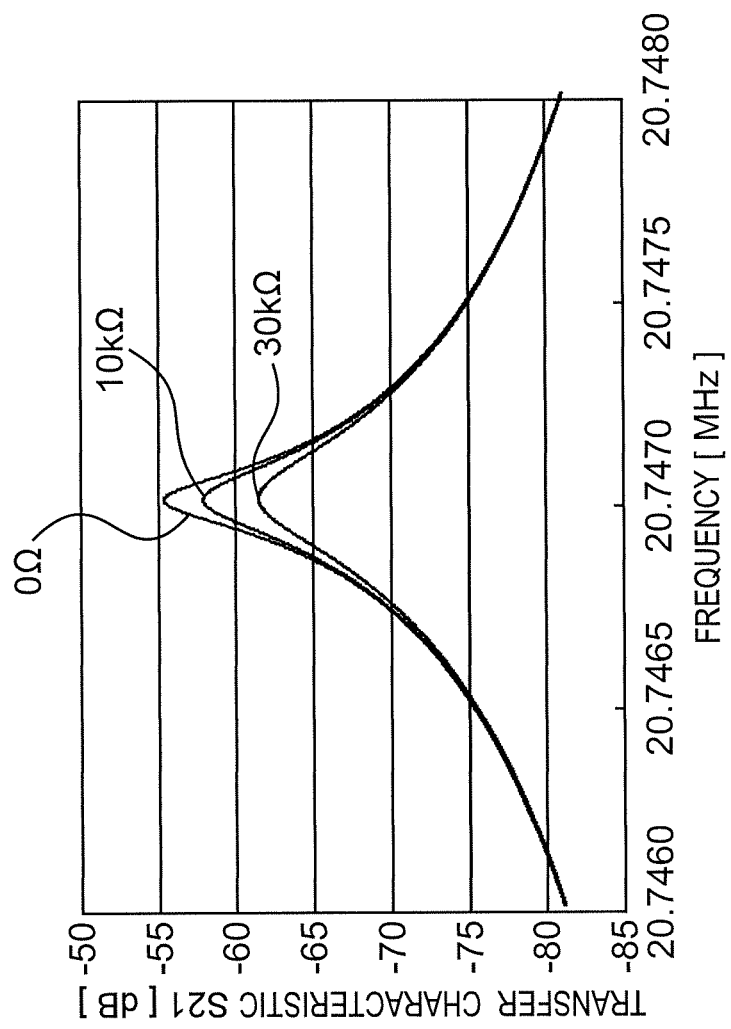
FIG. 5 is a graph illustrating S parameters S21 indicating input-to-output relationships of AC signals.
Figure 16:
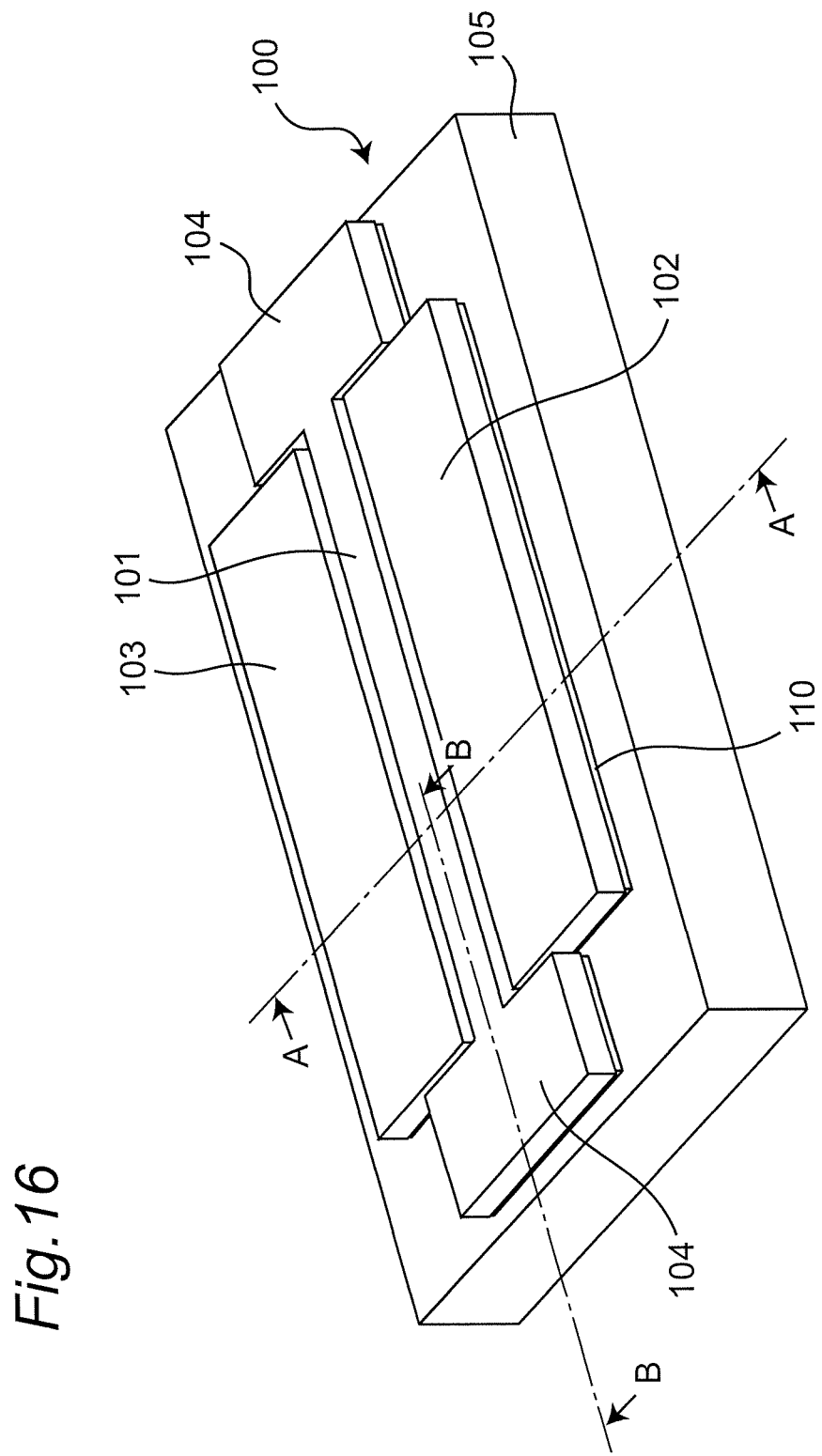
FIG. 16 is a perspective view of a conventional MEMS resonator formed by using an SOI (Silicon On Insulator) substrate.
Figure 17:
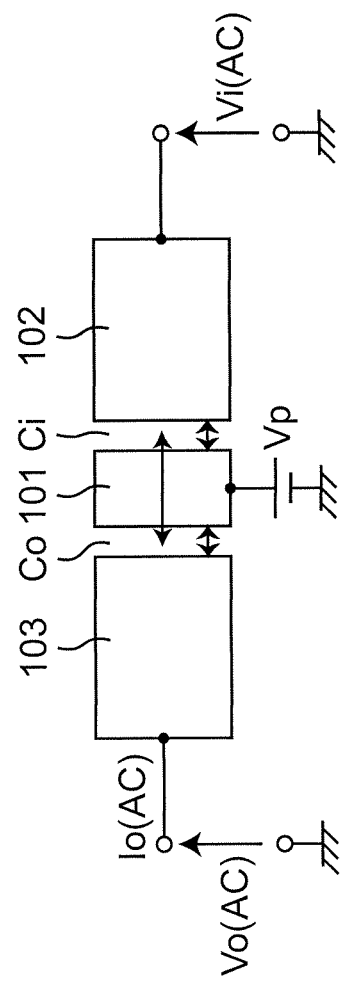
FIG. 17 is a view schematically illustrating the structure and the like of a cross section of the conventional MEMS resonator in FIG. 16, taken along the line A-A.
Figure 18:
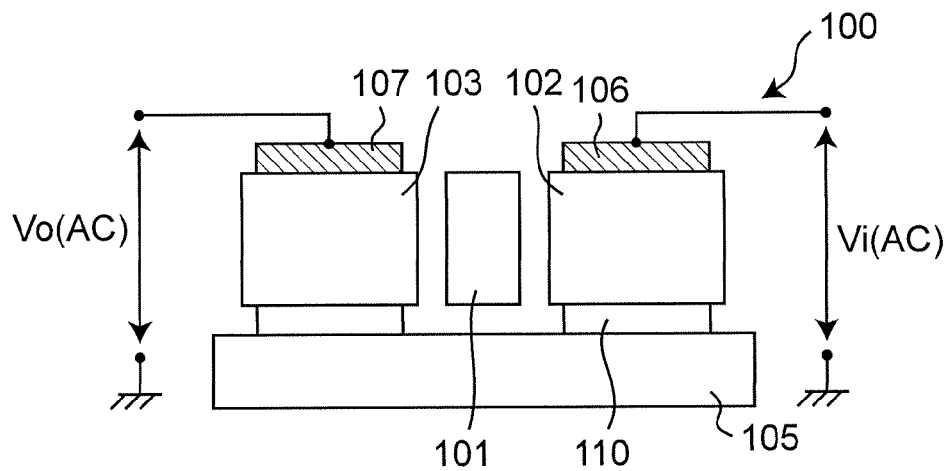
FIG. 18 is a cross-sectional view of the conventional MEMS resonator, taken along the line A-A.
Figure 19:
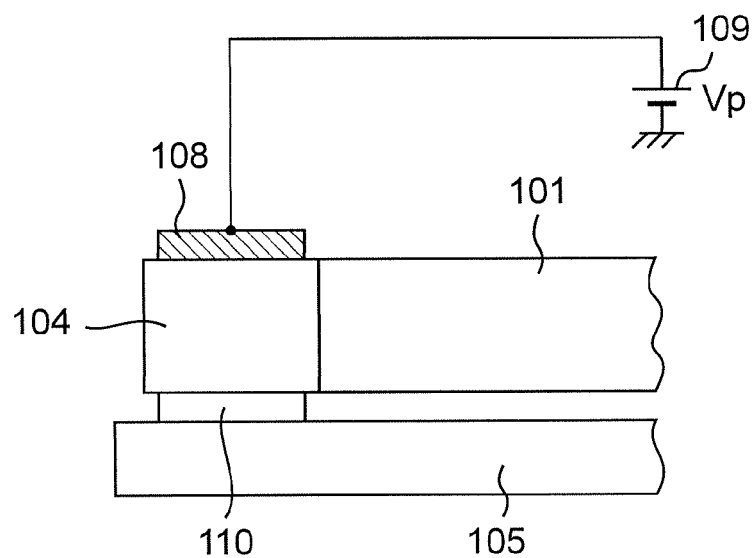
FIG. 19 is a cross-sectional view of the conventional MEMS resonator, taken along the line B-B.
Figure 22:
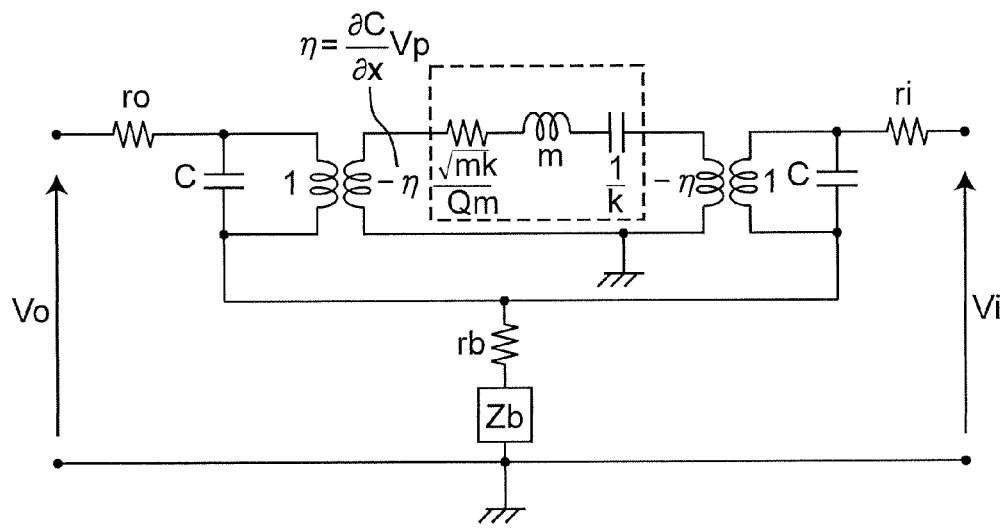
FIG. 22 is a circuit diagram illustrating an equivalent circuit, in consideration of barriers existing in an actual device of an MEMS resonator.

FIG. 5 illustrates S parameters S21 indicating input-to-output relationships of AC signals. Referring to FIG. 5, the lateral axis represents the frequency [MHz], while the vertical axis represents the transfer characteristic S21 [dB]. As indicated by the resonance characteristic curves in FIG. 5, the MEMS resonator has a resonance frequency of about 20 MHz. In the illustrated structure of the aforementioned conventional MEMS resonator illustrated in FIG. 16, the load resistance applied to AC currents is r=about 30 k*ohms. This load resistance forms the resistances ri, ro and rb in the equivalent circuit illustrated in FIG. 22. However, with the structure of the MEMS resonator according to the first embodiment, by flowing electric currents of 10 μA as the DC currents Ii (DC), Io (DC) and Ip (DC), the resistance is improved to r'=10 k*ohms, which results in reduction of the losses caused by the resistances, thereby increasing the acuteness of the peak of the resonance waveform as illustrated in FIG. 5. Namely, the MEMS resonator according to the first embodiment has a structure improved in such a way as to realize a higher Q factor.

Referring to FIG. 5, a resonance waveform having an ideal shape (r=0 ohm) has a degree of acuteness with a sheerly-mechanical Q factor (Qm). It can be seen that, with the MEMS resonator according to the first embodiment of the present invention, the degree of acuteness of resonance is closer to the ideal value Qm. The MEMS resonator having such a higher Q factor is capable of improving the minimum detection ability, when it is applied to a mass detector, for example. Further, the MEMS resonator having such a higher Q factor is capable of reducing phase noise, when it is applied to an oscillator, for example.

Further, in the MEMS resonator according to the first embodiment, the bypass resistances (14, 16, 19) used in the DC bypass circuits can be constituted by any devices having the function of blocking AC frequency signal components around the resonance frequency, such as devices having higher impedances in coils or semiconductor resistance devices. Further, in the first embodiment, the coil 18 provided in the output-side bias circuit 24 can be constituted by any of resistance devices and semiconductor resistance devices having the function of blocking AC frequency signal components around the resonance frequency.

Second Embodiment

Figure 6:
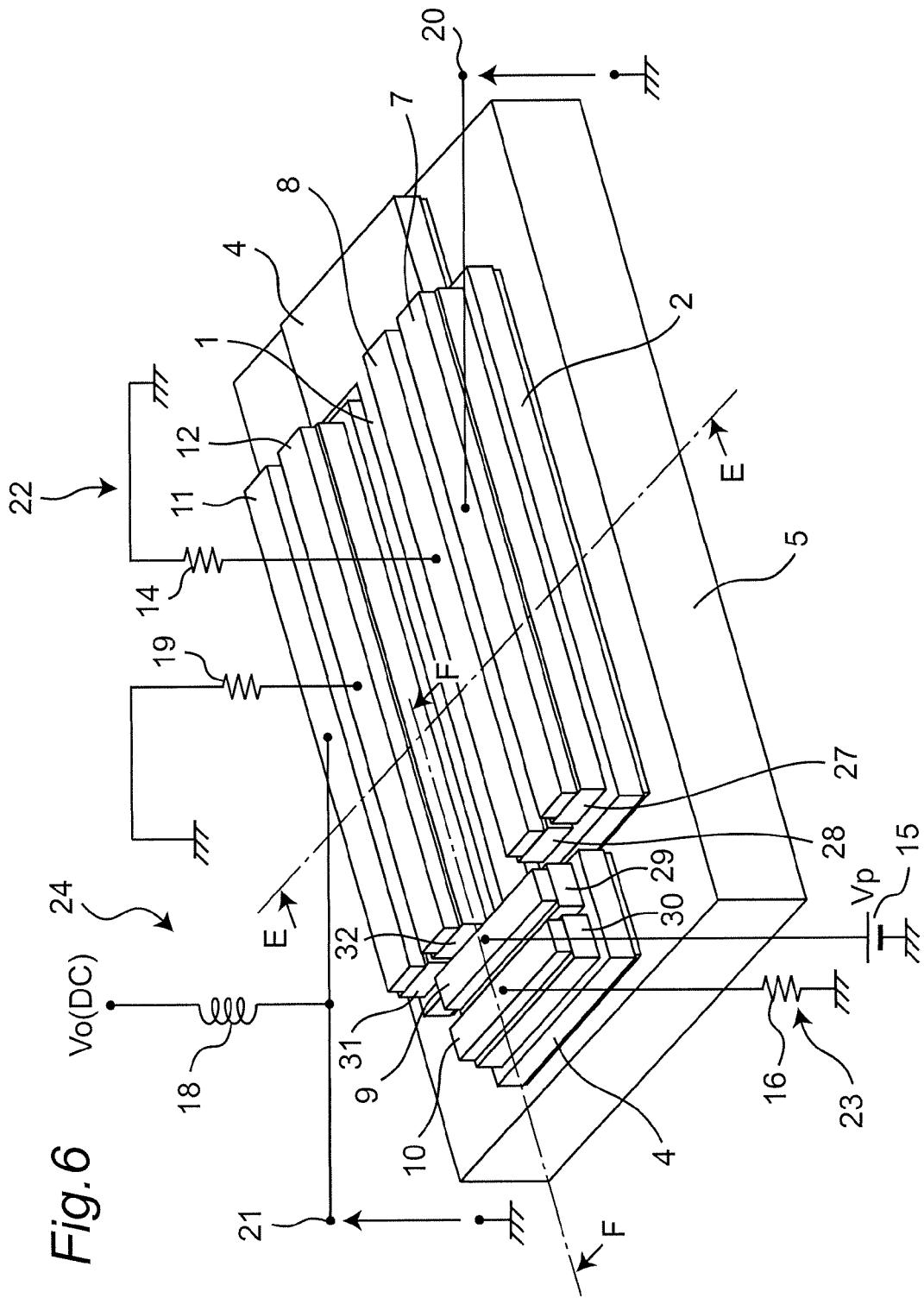
FIG. 6 is a perspective view illustrating a basic structure of a MEMS resonator according to a second embodiment.
Figure 7:
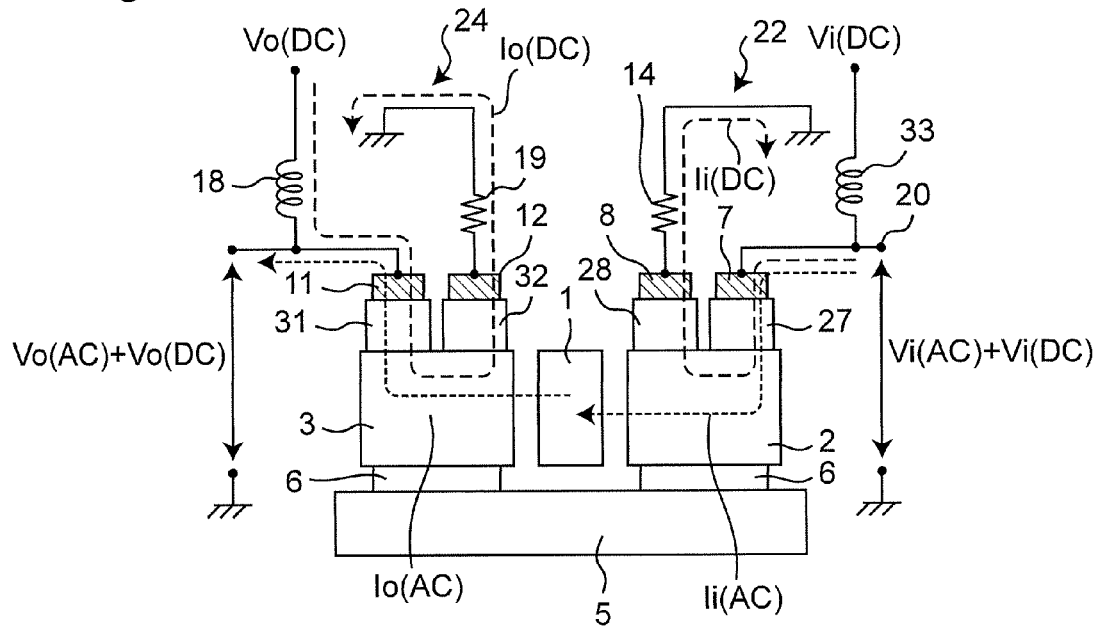
FIG. 7 is a cross-sectional view schematically illustrating the MEMS resonator according to the second embodiment for describing operations thereof.
Figure 8A:
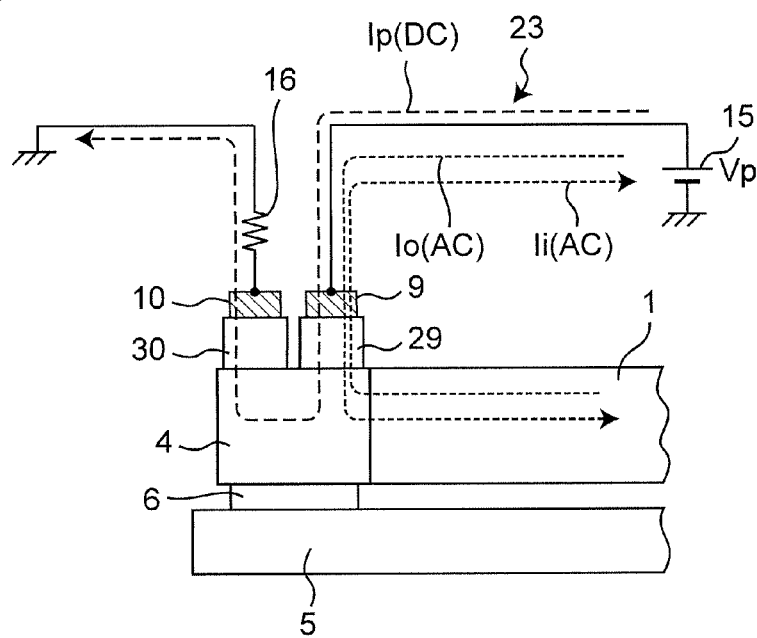
FIG. 8A is a cross-sectional view schematically illustrating an end portion of a vibrator and the vicinity thereof (including a supporting portion) in the MEMS resonator according to the second embodiment.

Hereinafter, there will be described a MEMS resonator according to a second embodiment of the present invention, with reference to the accompanying drawings. FIG. 6 is a perspective view illustrating the basic structure of the MEMS resonator according to the second embodiment of the present invention. FIG. 7 and FIG. 8A are cross-sectional views schematically illustrating the MEMS resonator according to the second embodiment for describing operations thereof. FIG. 7 illustrates a cross section of the MEMS resonator in FIG. 6, taken along the line E-E, and FIG. 8 illustrates a cross section of the MEMS resonator in FIG. 6, taken along the line F-F. Further, in FIG. 8A, there are illustrated one end portion of a vibrator (including a supporting portion 4) and the vicinity thereof.

The MEMS resonator according to the second embodiment is different from the MEMS resonator according to the aforementioned first embodiment, in that mediation layers are provided between metal layers and input/output layers. The structures of the other portions are the same as those of the MEMS resonator according to the aforementioned first embodiment and are formed by the same fabrication methods thereas. Accordingly, in the MEMS resonator according to the second embodiment, components having the same functions and structures as those of the MEMS resonator according to the first embodiment will be designated by the same reference characters, and the description of the first embodiment will be substituted for the description thereof. Further, in the structure according to the second embodiment, the metal layers and the mediation layers form intermediate layers.

In the MEMS resonator according to the second embodiment, on each of an input electrode 2, an output electrode 3 and a supporting portion 4, which are made of n-type semiconductors, there are formed metal layers such that mediation layers formed from two p-type semiconductor layers are interposed therebetween. These mediation layers formed from the p-type semiconductor layers play a role as spacers for forming surfaces at a larger height than that of a vibrator 1. For example, the vibrator 1 is covered, from thereabeove, with a thin film or a lid, to form a closed space (cavity) around the vibrator 1, in order to prevent intrusion of dusts and the like into the cavity from the outside, thereby protecting the vibrator 1 against obstructions which may inhibit vibrations of the vibrator 1. Further, as required, the cavity can be maintained in a vacuum, in order to eliminate the viscosity of air, thereby realizing resonance characteristics with a higher degree of acuteness. In this case, in electric-signal paths, there exist the metal/p-type-semiconductor junction interfaces and the pn junction interfaces, and these junction interfaces form barriers.

In the MEMS resonator according to the second embodiment, in the electric-signal path from an input terminal 20 to an output terminal 21, there exist the barriers of the junction interfaces where the metal layers and the p-type semiconductors are bonded to each other and the p-type semiconductors and the n-type semiconductors are bonded to each other (the junction interfaces), and there are electric connections at these junction interfaces.

The MEMS resonator according to the second embodiment is structured such that DC currents are passed through the junction interfaces between the metal layers and the p-type semiconductors and between the p-type semiconductors and the n-type semiconductors, and these DC currents flow to a common electric-potential source through DC bias circuits. The DC bias circuits are circuits for releasing only the injected DC currents without passing AC signals therethrough and, further, are constituted by the common electric-potential source and a device having a higher impedance with respect to AC signals within a frequency range around the resonance frequency of the vibrator 1, similarly to the DC bias circuits according to the aforementioned first embodiment.

In the MEMS resonator according to the second embodiment, on the surface of the input electrode 2, there are placed an intermediate layer constituted by a first input-side mediation layer 27 (p type) and a first input-side metal layer 7 which are laminated thereon, and an intermediate layer constituted by a second input-side mediation layer 28 (p type) and a second input-side metal layer 8 which are laminated thereon, such that these intermediate layers are spaced apart from each other. Further, on the surface of the output electrode 3, there are placed an intermediate layer constituted by a first output-side mediation layer 31 (p type) and a first output-side metal layer 11 which are laminated thereon, and an intermediate layer constituted by a second output-side mediation layer 32 (p type) and a second output-side metal layer 12 which are laminated thereon, such that these intermediate layers are spaced apart from each other. Further, on the surface of one of the supporting portions 4 at the opposite end portions of the vibrator 1, there are placed an intermediate layer constituted by a first support-side mediation layer 29 (p type) and a first support-side metal layer 9 which are laminated thereon, and an intermediate layer constituted by a second support-side mediation layer 30 (p type) and a second support-side metal layer 10 which are laminated thereon, such that these intermediate layers are spaced apart from each other.

A bypass resistance 14 in a DC bias circuit 22 which is provided in the signal-input side plays the same role as that of the bypass resistance 14 described in the first embodiment.

An AC voltage Vi (AC) as an AC signal is applied to the input terminal 20. Further, a DC voltage Vi (DC) from a DC power supply is applied, through a coil 33, to the first input-side metal layer 7 to which the input terminal 20 is connected. Accordingly, the voltage formed from the DC voltage Vi (DC) and the AC voltage Vi (AC) which are superimposed on each other is applied to the first input-side metal layer 7. At this time, an AC current Ii (AC) passes through the first input-side metal layer 7, the first input-side mediation layer 27 (p type) and the input electrode 2 (n type) and, further, flows to the vibrator 1 (n-type), through the capacitance (Ci) of an input-side facing portion 25.

Further, as illustrated in FIG. 8A, the AC current Ii (AC) passes from the vibrator 1 through the supporting portion 4 and, further, flows into the ground electric potential which forms the common electric-potential source, through the first support-side mediation layer 29 and the first support-side metal layer 9. In the supporting portion 4 illustrated in FIG. 8A, the AC current Ii (AC) flows in the direction to a bias power supply 15 having a lower internal resistance than that of a bypass resistance 16.

Further, in the DC bias circuit 22 in the input-side, which is illustrated in FIG. 7, a DC current Ii (DC) induced by the DC voltage Vi (DC) passes through the first input-side metal layer 7, the first input-side mediation layer 27 (p type) and the input electrode 2 (n type), further passes through the second input-side mediation layer 28 (p type) and the second input-side metal layer 8 and flows to the ground electric potential, through the bypass resistance 14. The value of the bypass resistance 14 in the input side is set to be larger than that of the impedance of the capacitance (Ci) of the input-side facing portion 25. Therefore, the amount of the electric current flowed through the bypass resistance 14, out of the AC current Ii (AC), is negligible.

On the other hand, in a DC bias circuit 24 in the output side, which is illustrated in FIG. 7, a DC voltage Vo (DC) is applied to the first output-side metal layer 11 which is connected to the output terminal 21. The DC voltage Vo (DC) is applied thereto through a coil 18 having a higher impedance with respect to frequencies of AC signals to be flowed through the MEMS resonator. A DC current To (DC) induced by the DC voltage Vo (DC) passes through the first output-side metal layer 11, the first output-side mediation layer 31 (p type) and the output electrode 3 (n type), further passes through the second output-side mediation layer 32 (p type) and the second output-side metal layer 12 and, further, flows to the ground electric potential as the common electric-potential source, through a bypass resistance 19.

When the vibrator 1 is vibrated, the capacitance (Co) of an output-side facing portion 26 is changed, thereby inducing an output AC current Io (AC). The output AC current Io (AC)

flows from the ground electric potential illustrated in FIG. 8A through the first support-side metal layer 9, the first support-side mediation layer 29 and the supporting portion 4 to the vibrator 1. Further, the output AC current Io (AC) is outputted along the electric-signal path from the vibrator 1 illustrated in FIG. 7 through the capacitance (Co) of the output-side facing portion 26, the output electrode 3, the first output-side mediation layer 31 and the first output-side metal layer 11 to the output terminal 21.

As illustrated in FIG. 8A, in a DC bias circuit 23 in the support side, a bias voltage Vp from the bias power supply 15 is applied to the first support-side metal layer 9. Therefore, a DC current Ip (DC) induced by the bias voltage Vp passes through the first support-side metal layer 9, the first support-side mediation layer 29 and the supporting portion 4 and, further, flows to the ground electric potential, through the second support-side mediation layer 30, the second support-side metal layer 10 and the bypass resistance 16. Further, in the second embodiment, the first support-side metal layer 9 is connected to the bias power supply 15 through a bias terminal.

With the structure illustrated in FIG. 7, when the input AC current Ii (AC) passes through the respective junction interfaces between the first input-side metal layer 7, the first input-side mediation layer 27 and the input electrode 2, the DC current Ii (DC) flows therethrough at the same time. Similarly, when the output AC current Io (AC) passes through the respective junction interfaces between the output electrode 3, the first output-side mediation layer 31, and the first output-side metal layer 11, the DC current Io (DC) flows therethrough at the same time.

Further, with the structure illustrated in FIG. 8A, when the input AC current Ii (AC) and the output AC current Io (AC) pass through the respective junction interfaces between the first support-side metal layer 9, the first support-side mediation layer 9 and the supporting portion 4, the DC current Ip (DC) flows therethrough at the same time. Namely, the DC current is superimposed on the AC current, at the metal-semiconductor (the metal-n junctions and the metal-p junctions) junction interfaces, and at the p-type/n-type semiconductor (the pn junctions, the pp junctions and the nn junctions) junction interfaces. As a result thereof, as represented by the aforementioned V-I characteristic curve illustrated in FIG. 20, an operating point can be moved, which enables reducing the load resistance applied to the AC current, thereby reducing the resistance value r' (see FIG. 20) in comparison with the resistance value r of when no DC current is flowed therethrough. This can largely reduce the electric energy loss in the AC current.

Further, in the second embodiment, it is also possible to employ structures illustrated in FIGS. 8B to 8E, for example, as well as the structure illustrated in FIG. 8A.

FIG. 8B, which illustrates a cross-sectional view similar to that of FIG. 8A, illustrates a structure in which a first support-side metal layer 9 is connected to a bias power supply 15 through a bias terminal and a bypass resistance 16, and a second support-side metal layer 10 is connected to a ground electric potential.

Figure 8D:
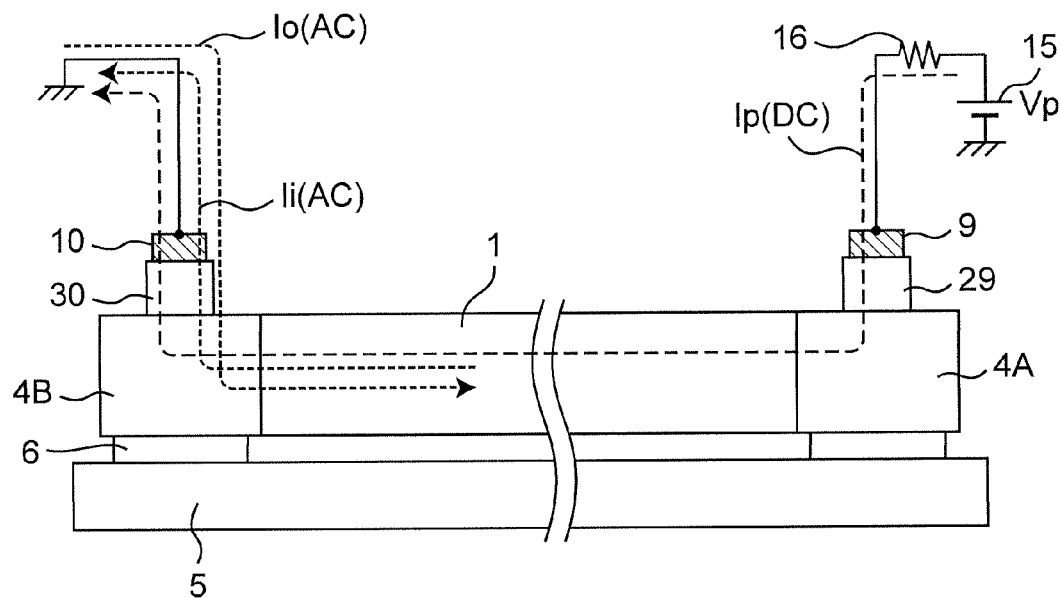
FIG. 8D is a cross-sectional view schematically illustrating an end portion of a vibrator and the vicinity thereof (including a supporting portion) in a MEMS resonator having another structure according to the second embodiment.
Figure 8E:
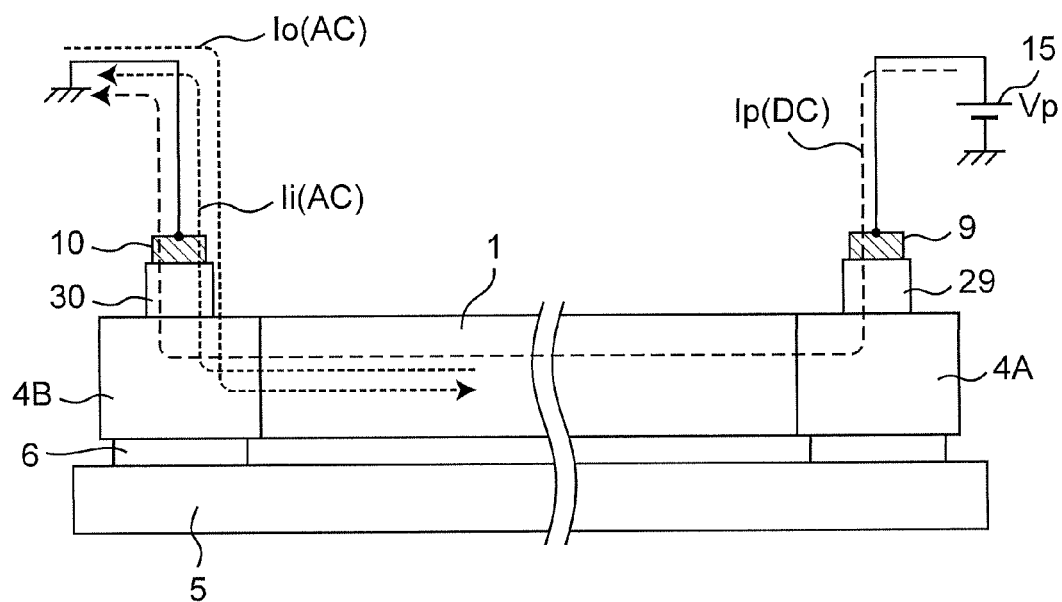
FIG. 8E is a cross-sectional view schematically illustrating an end portion of a vibrator and the vicinity thereof (including a supporting portion) in a MEMS resonator having another structure according to the second embodiment.

FIGS. 8C to 8E are cross-sectional views illustrating the respective structures of vibrators 1 having both-ends-supported beam shapes, in such a way as to omit midway portions thereof, wherein supporting portions 4A and 4B at the opposite sides of the vibrator 1 are provided with respective intermediate layers for flowing DC currents through the vibrator 1. Namely, the first supporting portion 4A is provided with a first intermediate layer constituted by a first support-side metal layer 9 and a first support-side mediation layer 29, and the second supporting portion 4B is provided with a second intermediate layer constituted by a second support-side metal layer 10 and a second support-side mediation layer 30.

In the structure illustrated in FIG. 8C, the first support-side metal layer 9 in the first intermediate layer formed on the first supporting portion 4A is connected to a bias power supply 15 through a bias terminal, while the second support-side metal layer 10 in the second intermediate layer formed on the second supporting portion 4B is connected to the ground electric potential through a bypass resistance 16.

In the structure illustrated in FIG. 8D, the first support-side metal layer 9 in the first intermediate layer formed on the first supporting portion 4A is connected to a bias power supply 15 through a bias terminal and a bypass resistance 16, while the second support-side metal layer 10 in the second intermediate layer formed on the second supporting portion 4B is connected to the ground electric potential.

In the structure illustrated in FIG. 8E, the first support-side metal layer 9 in the first intermediate layer formed on the first supporting portion 4A is connected to a bias power supply 15 through a bias terminal, while the second support-side metal layer 10 in the second intermediate layer formed on the second supporting portion 4B is connected to the ground electric potential. In the structure illustrated in FIG. 8E, the DC bias circuit is provided with no impedance device, but the vibrator 1 is included in the electric-current path in the DC bias circuit, and the vibrator itself has an impedance, which eliminates the necessity for providing an additional impedance device.

Due to the aforementioned structures, the MEMS resonator according to the second embodiment is capable of increasing the acuteness of the peaks of resonance waveforms as illustrated in FIG. 5 and, therefore, is improved in such a way as to realize higher Q factors, similarly to the MEMS resonator according to the aforementioned first embodiment.

Third Embodiment

Hereinafter, there will be described an MEMS resonator according to a third embodiment of the present invention, with reference to the accompanying drawings. While the structure of the aforementioned second embodiment has been described with respect to an example where it has three structural portions, which are "the input electrode", "the vibrator (the supporting portions)" and "the output electrode", the MEMS resonator according to the third embodiment is structured such that "a vibrator (supporting portions)" also serves as "an output electrode". In the structure of the MEMS resonator according to the third embodiment, the structures of the other portions are the same as those of the MEMS resonator according to the second embodiment and are formed by the same fabrication methods thereas. Accordingly, in the MEMS resonator according to the third embodiment, components having the same functions and structures as those of the MEMS resonator according to the second embodiment will be designated by the same reference characters, and the description of the second embodiment will be substituted for the description thereof. Further, in the structure according to the third embodiment, metal layers and mediation layers form respective intermediate layers.

Figure 9:
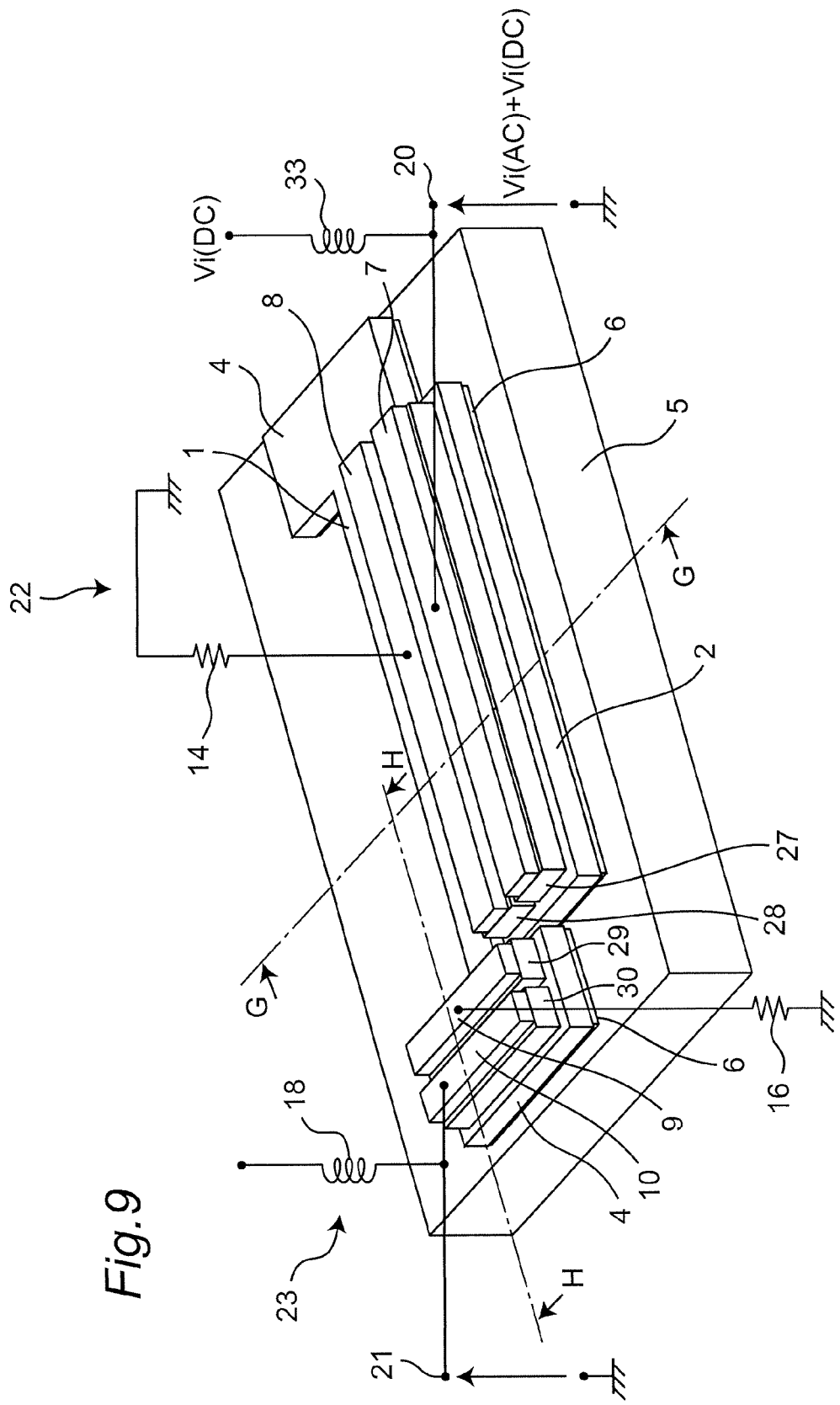
FIG. 9 is a perspective view illustrating a basic structure of a MEMS resonator according to a third embodiment of the present invention.
Figure 10:
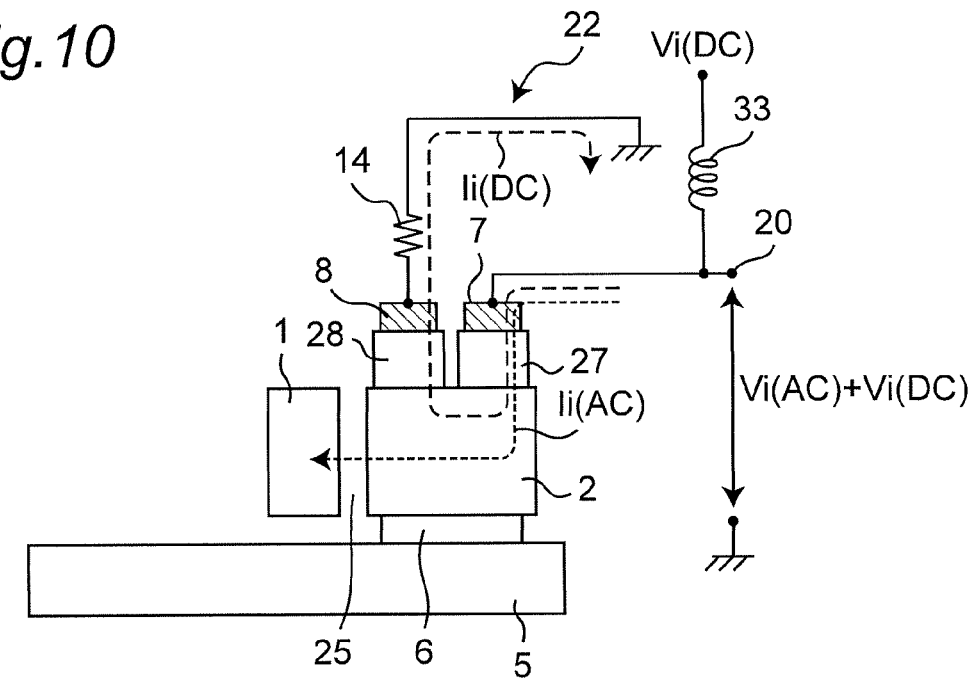
FIG. 10 is a cross-sectional view schematically illustrating the MEMS resonator according to the third embodiment for describing operations thereof.
Figure 11:
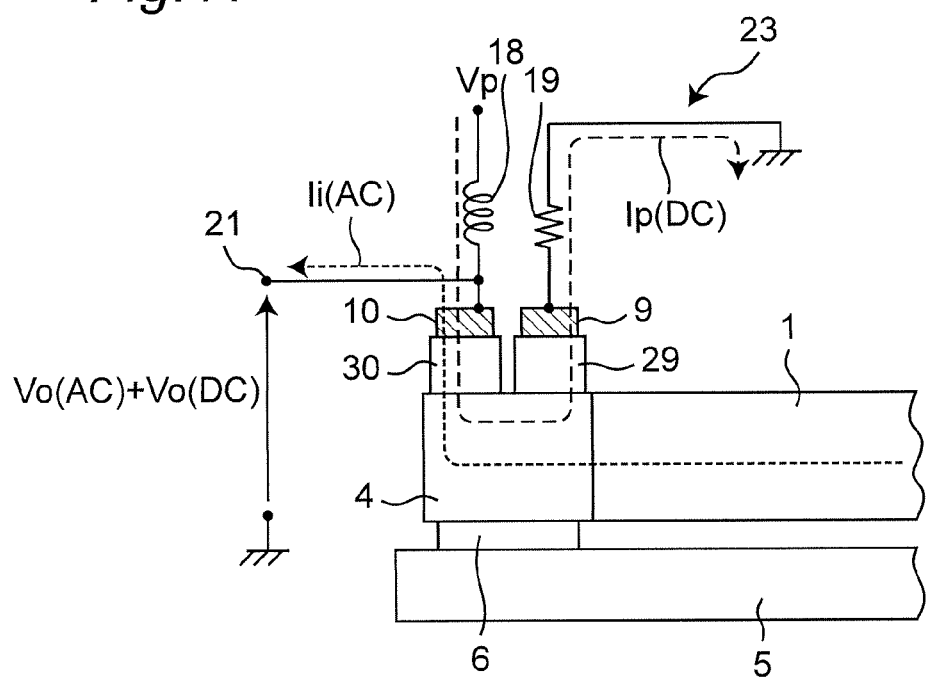
FIG. 11 is a cross-sectional view schematically illustrating the MEMS resonator according to the third embodiment for describing operations thereof.

FIG. 9 is a perspective view illustrating a basic structure of the MEMS resonator according to the third embodiment of the present invention. FIG. 10 and FIG. 11 are cross-sectional views schematically illustrating the MEMS resonator according to the third embodiment for describing operations thereof, wherein FIG. 10 illustrates a cross section of the MEMS resonator in FIG. 9, taken along the line G-G, and FIG. 11 illustrates a cross section of the MEMS resonator in FIG. 9, taken along the line H-H. Further, in FIG. 11, there are illustrated one end portion of a vibrator and the vicinity thereof.

In the MEMS resonator according to the third embodiment, a first support-side metal layer 9 formed on a supporting portion 4 is connected to a ground electric potential through a bypass resistance 19, as illustrated in FIG. 9. On the other hand, a second support-side metal layer 10 is connected in such a way that a bias voltage Vp is inputted thereto through a coil 18. Further, the second support-side metal layer 10 is connected to an output terminal 21. Further, the structure of the input-electrode side is the same as that of the aforementioned second embodiment. Accordingly, in the MEMS resonator according to the third embodiment, the supporting portions 4 support the vibrator 1 at its opposite ends and, also, perform the function of an output electrode. Accordingly, in the structure according to the third embodiment, similarly, there exist the junction interfaces, which are the metal/p-type-semiconductor junction interfaces and the pn junction interfaces, in the electric-signal paths, and these junction interfaces form barriers.

With the structure of the MEMS resonator according to the third embodiment, when an input AC current Ii (AC) passes through the respective junction interfaces between the first input-side metal layer 7, the first input-side mediation layer 27 and the input electrode 2, a DC current Ii (DC) flows therethrough at the same time. Further, when an output AC current Io (AC) passes through the respective junction interfaces between the vibrator 1 (the supporting portion 4), the second support-side mediation layer 30 and the second support-side metal layer 10, a DC current Ip (DC) flows therethrough at the same time. Namely, the DC current is superimposed on the AC current, at the metal-semiconductor junction interfaces and at the p-type/n-type semiconductor junction interfaces. As a result thereof, as represented by the aforementioned V-I characteristic curve illustrated in FIG. 20, an operating point can be moved, which enables reducing the load resistance applied to the AC current, thereby reducing the resistance value r' in comparison with the resistance value r of when no DC current is flowed therethrough. This can reduce the electric energy loss in the AC current.

Since the MEMS resonator according to the third embodiment has the aforementioned structure, the MEMS resonator is capable of increasing the acuteness of the peaks of resonance waveforms as illustrated in FIG. 5 and, therefore, is improved in such a way as to realize higher Q factors, similarly to the MEMS resonator according to the aforementioned first embodiment.

Fourth Embodiment

Hereinafter, there will be described a MEMS resonator according to a fourth embodiment of the present invention, with reference to FIGS. 12 to 14.

In the MEMS resonator according to the present invention, the structure of the vibrator is not limited to a both-ends-supported beam type and can be also a cantilever-beam type. Further, the MEMS resonator according to the present invention can be adapted to vibrators having various shapes, such as disk (circular) shapes as described in the aforementioned "Patent Literature 1", ring (annular) shapes, square (rectangular) shapes and, therefore, the vibrator is not limited to a beam-type vibrator. Accordingly, resonance modes which are excited in the vibrator are not limited to flexural vibrations. For example, the MEMS resonator according to the present invention can employ torsional vibration modes in which the vibrator performs torsional vibrations, even when the vibrator is of a beam type.

The MEMS resonator according to the fourth embodiment of the present invention represents an example of an MEMS resonator structured to be provided with a vibrator in a torsional vibration mode. In the MEMS resonator according to the fourth embodiment, the vibrator is a triangular column having a triangular cross section, and an input electrode and an output electrode are provided such that they face the respective surfaces forming two sides of the triangular shape. The structures of the other portions are the same as those of the MEMS resonator according to the aforementioned second embodiment. Accordingly, in the MEMS resonator illustrated in FIGS. 12 to 14, components having the same functions and structures as those of the MEMS resonator according to the second embodiment will be designated by the same reference characters, and the description of the second embodiment will be substituted for the description thereof. Further, in the structure according to the fourth embodiment, metal layers and mediation layers form respective intermediate layers.

Figure 12:
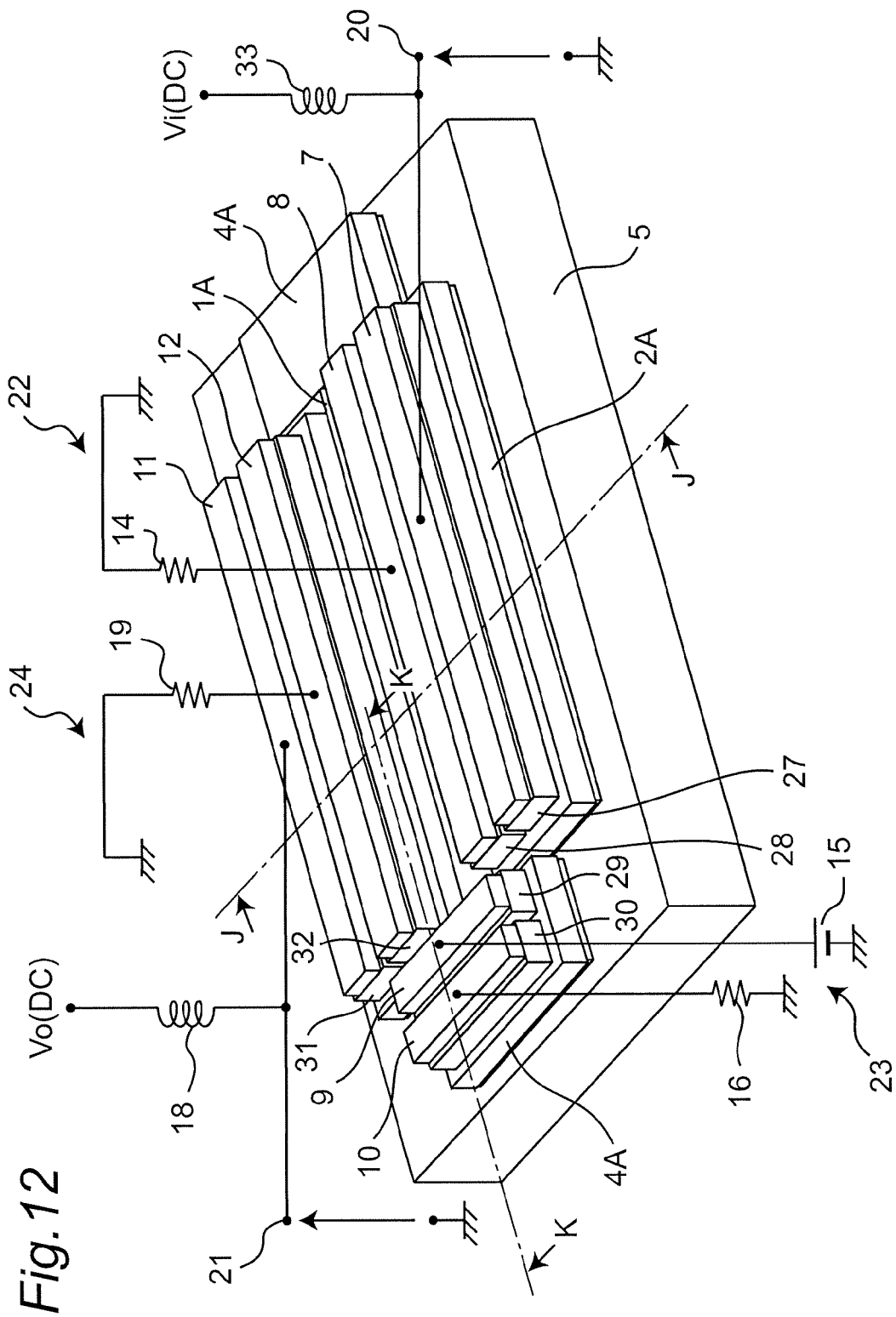
FIG. 12 is a perspective view illustrating a basic structure of a MEMS resonator according to a fourth embodiment of the present invention.

FIG. 12 is a perspective view illustrating a basic structure of the MEMS resonator according to the fourth embodiment of the present invention. FIG. 13 and FIG. 14 are cross-sectional views schematically illustrating the MEMS resonator according to the fourth embodiment for describing operations thereof. FIG. 13 illustrates a cross section of the MEMS resonator in FIG. 12, taken along the line J-J, and FIG. 14 illustrates a cross section of the MEMS resonator in FIG. 12, taken along the line K-K. Further, in FIG. 14, there are illustrated one end portion of a vibrator and the vicinity thereof.

Figure 13:
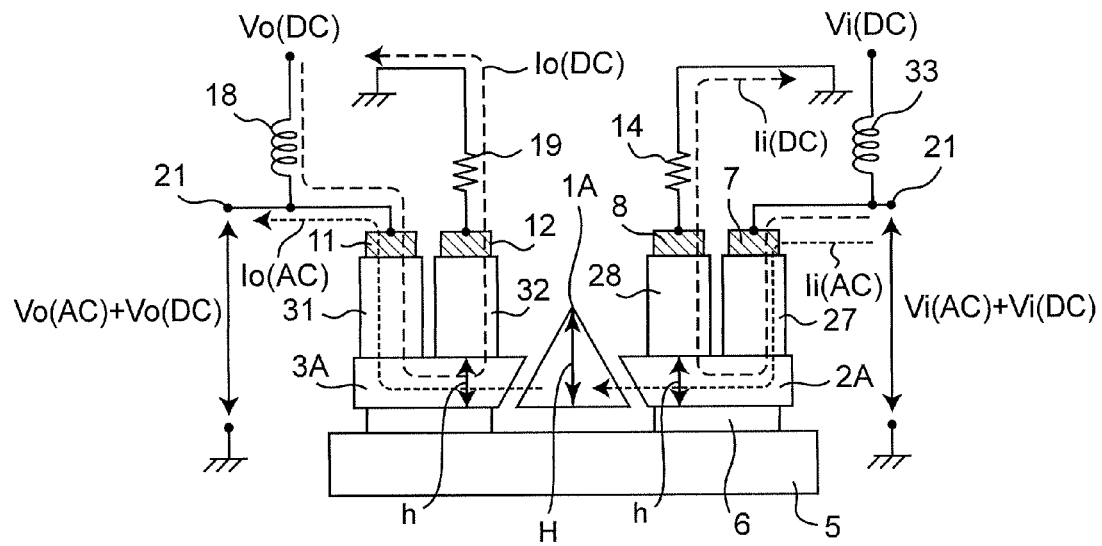
FIG. 13 is a cross-sectional view schematically illustrating the MEMS resonator according to the fourth embodiment for describing operations thereof.

As illustrated in FIG. 13, in the MEMS resonator according to the fourth embodiment, the vibrator 1A has a beam shape having a triangular cross section, and the material thereof is a single-crystal silicon. The vibrator 1A has a triangular cross section, since it is defined by two surfaces formed from crystal orientation planes {111} and a single surface formed from a crystal orientation plane {100}. A moment of an electrostatic force from the input electrode 2A is applied to the vibrator 1A having the triangular cross section, for exciting torsional vibrations thereof. When the vibrator 1A induces torsional vibrations therein, the torsional vibrations induce an electric current, which is outputted from the output electrode 3A. An input-side facing portion 25A is provided by forming a facing surface of the input electrode 2A such that it faces a single surface forming the triangular shape of the vibrator 1A. Further, an output-side facing portion 26A is provided by forming a facing surface of the output electrode 3A such that it faces another surface forming the triangular shape of the vibrator 1A. Here, the input-side facing portion 25A is a capacitance portion (Ci) which is constituted by the surfaces of the input electrode 2A and the vibrator 1A which are faced to each other, and the output-side facing portion 26A is a capacitance portion (Co) which is constituted by the surfaces of the output electrode 3A and the vibrator 1A which are faced to each other.

In order to structure the MEMS resonator according to the fourth embodiment, such that it outputs electric currents induced by torsional vibrations therein, the height (a reference character h in FIG. 13) of the input electrode 2A and the output electrode 3A is set to be about ½ the height of the vibrator 1A (a reference character H in FIG. 13). Further, the input electrode 2A and the output electrode 3A are placed such that their bottom surfaces and the bottom surface of the vibrator 1A are in the same plane. Further, in the MEMS resonator according to the fourth embodiment, the other portions, such as the metal layers, the mediation layers, the bypass resistances, are the same as those of the MEMS resonator according to the aforementioned second embodiment, regarding the structures, the functions and the operations.

In the MEMS resonator according to the fourth embodiment, as illustrated in FIG. 13, when an input AC current Ii (AC) passes through the respective junction interfaces between the first input-side metal layer 7, the first input-side mediation layer 27 and the input electrode 2A, a DC current Ii (DC) flows therethrough at the same time. Similarly, when an output AC current Io (AC) passes through the respective junction interfaces between the output electrode 3A, the first output-side mediation layer 31 and the first output-side metal layer 11, a DC current Ip (DC) flows therethrough at the same time.

Figure 14:
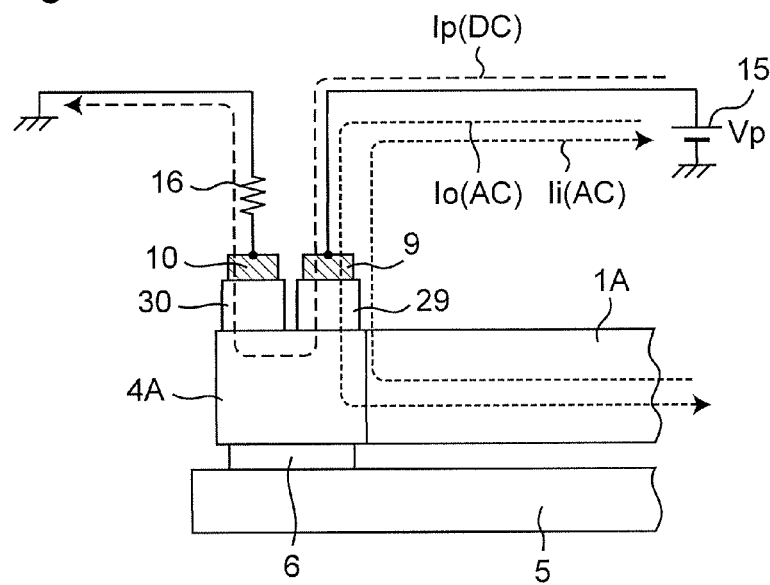
FIG. 14 is a cross-sectional view schematically illustrating the MEMS resonator according to the fourth embodiment for describing operations thereof.

Further, in the MEMS resonator according to the fourth embodiment, as illustrated in FIG. 14, when the input AC current Ii (AC) and the output AC current Io (AC) pass through the respective junction interfaces between the first input-side metal layer 9, the first support-side mediation layer 29 and the supporting portion 4, the DC current Ip (DC) flows therethrough at the same time. Namely, the DC current is superimposed on the AC current, at the metal-semiconductor junction interfaces and the p-type/n-type semiconductor junction interfaces. As a result thereof, as represented by the aforementioned V-I characteristic curve illustrated in FIG. 20, an operating point can be moved, which enables reducing the load resistance applied to the AC current, thereby reducing the resistance value r' in comparison with the resistance value r of when no DC current is flowed therethrough. This can reduce the electric energy loss in the AC current.

The MEMS resonator having the aforementioned structure according to the fourth embodiment is capable of increasing the acuteness of the peaks of resonance waveforms as illustrated in FIG. 5 and, therefore, is improved in such a way as to realize higher Q factors, similarly to the MEMS resonator according to the aforementioned first embodiment.

Although, in the aforementioned respective embodiments, there have been described the laminated-layer structures formed from the metal layers, the mediation layers (p type), the input/output electrodes (n type) and the like, it is also possible to interchange the p type and the n type therein, which can also provide the same effects. Further, even in a p-type/p-type laminated-layer structure, there is induced a barrier at the junction interface and, therefore, it is possible to provide, thereon, the same effects as those of the aforementioned embodiments, with structures based on the technical concept of the present invention. Similarly, it is also possible to provide the same effects on n-type/n-type laminated-layer structures and on pnp and npn composite laminated-layer structures. Further, it is also possible to provide the same effects on metal-semiconductor laminated-layer structures having no mediation layers interposed therein.

Figure 15:
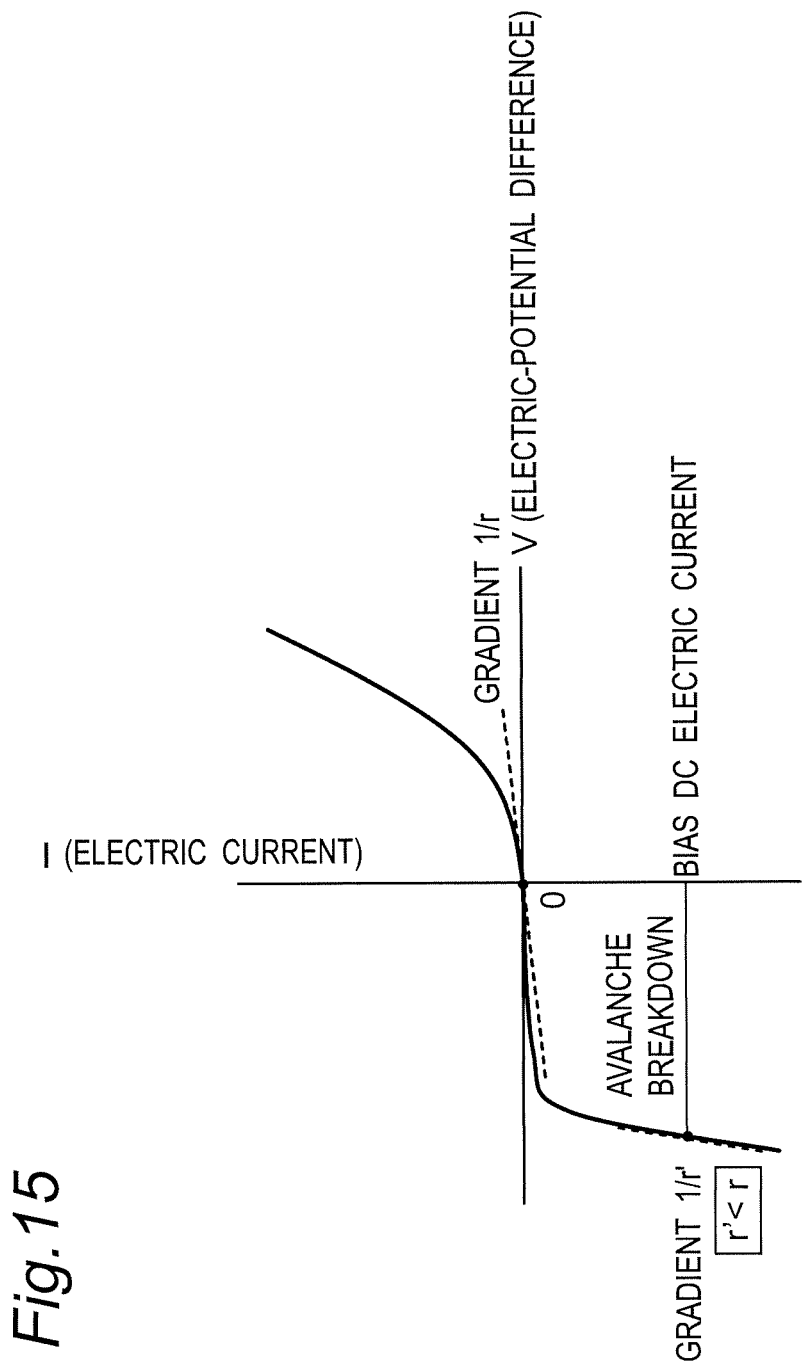
FIG. 15 is a graph illustrating an example of a V-I characteristic curve at a junction interface in an MEMS resonator.
Figure 20:
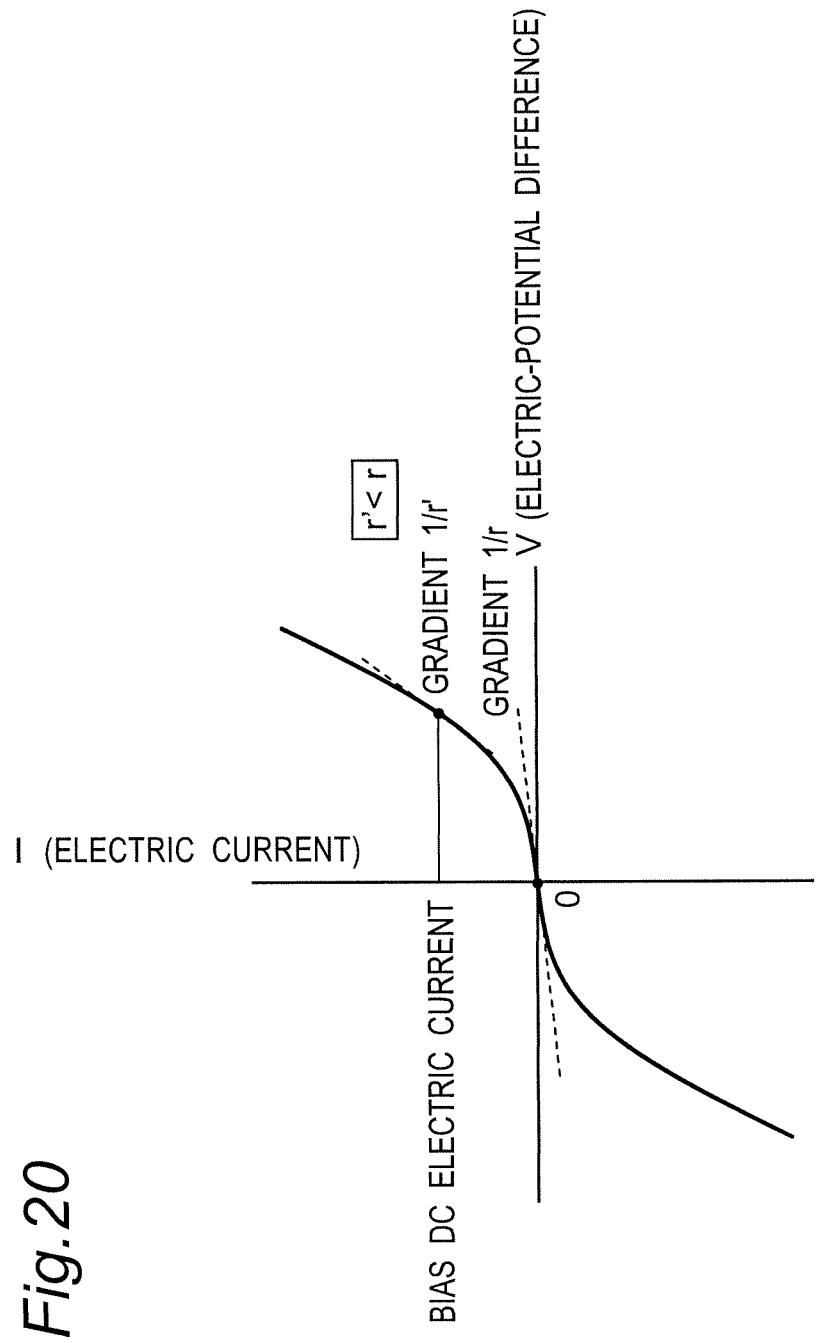
FIG. 20 is a graph illustrating an example of a V-I characteristic curve at a junction interface between a metal layer and a p-type semiconductor.
Figure 21:
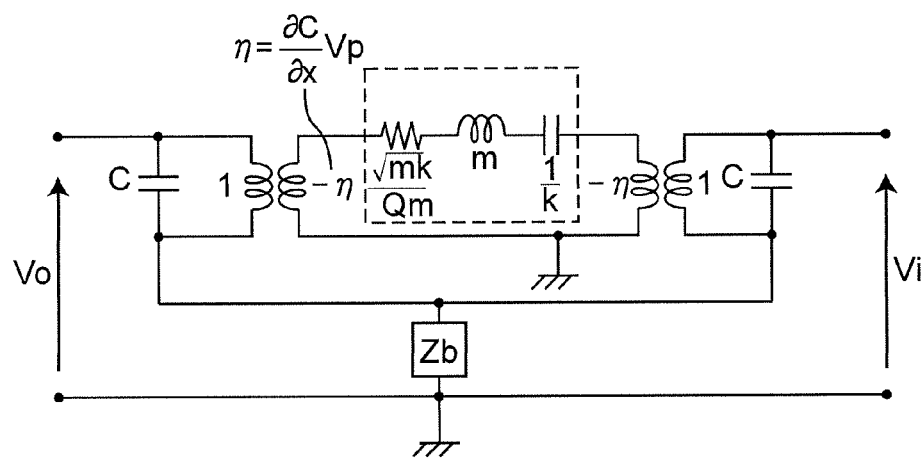
FIG. 21 is a circuit diagram illustrating an ideal equivalent circuit of a resonator in FIG. 17.

Further, a DC operating point, which is defined in a V-I (voltage-current) characteristic caused by the barrier at a junction interface between a metal layer, a mediation layer, an input electrode, an output electrode and the like, can be also utilized in a reverse-bias area in the characteristic curve illustrated in FIG. 20. Particularly, the use of the reverse-bias area produces prominent effects, in a state where there exists an avalanche breakdown in the reverse-bias area in the V-I characteristic curve illustrated in FIG. 15. By setting the bias DC current in the avalanche-breakdown area in which the V-I characteristic curve has a larger gradient, it is possible to significantly reduce the resistance r' applied to AC signals.

Although the structures according to the respective embodiments have been described by specifying the positions at which the DC power supply and the common electric potential source are connected therein, the present invention does not specify the positions at which the DC power supply and the common electric potential source are connected, and they can be also connected in the opposite way from that in the structures according to the respective embodiments. Further, the DC bias circuits in the input side and in the output side are required only to have impedances in these DC bias circuits, and the present invention does not specify the positions at which impedance devices are placed. Further, the DC bias circuits in the input side and in the output side are required only that the inductance devices provided therein are connected such that signals passed through junction interfaces are divided into DC signals and AC signals, and only the AC signals are flowed from the input terminal to the output terminal, and the present invention is not limited to the structures described in the aforementioned respective embodiments.

The MEMS resonator according to the present invention can be applied to filter circuits which utilize the fact that electricity-passage characteristics between input and output electrodes are improved only at certain frequencies, namely only around the resonance frequencies of vibrators and, also, can be applied to temperature sensors, pressure sensors and mass sensors and the like which utilize the fact that the resonance frequencies of vibrators are shifted due to the temperature, stresses applied to the vibrators, small amounts of substances adhered to the vibrators, and the like. In these cases, it is possible to improve the performance of these respective devices.

As described above, with the MEMS resonator according to the present invention, it is possible to reduce losses in AC signals due to resistances caused by barriers existing at metal/semiconductor-layer junction surfaces and the like, thereby realizing resonance characteristics having higher Q factors. Therefore, with the present invention, it is possible to provide an improvement in terms of the minimum detectable mass, when it is applied to a mass detector. Further, it is possible to reduce phase noise, when it is applied to an oscillator. Also, the present invention can be also applied to wide industrial applications, such as filter circuits using resonances, gyroscopes, pressure sensors, optical scanners, mass detection devices.

INDUSTRIAL APPLICABILITY

The MEMS resonator according to the present invention can reduce losses in AC signals due to resistances caused by barriers existing at metal/semiconductor-layer junction surfaces and the like, thereby realizing resonance characteristics having higher Q factors. Therefore, the MEMS resonator according to the present invention can be widely used in various types of fields.

REFERENCE SIGNS LIST

1 Vibrator
2 Input electrode
3 Output electrode
4 Supporting portion
5 Silicon substrate
6 Embedded oxide layer
7 First input-side metal layer
8 Second input-side metal layer
9 First support-side metal layer
10 Second support-side metal layer
11 First output-side metal layer
12 Second output-side metal layer
13 Input-side DC power supply
14 Input-side bypass resistance
15 Support-side bias power supply
16 Support-side bypass resistance 17 Output-side DC power supply
18 Output-side coil
19 Output-side bypass resistance
20 Input terminal
21 Output terminal
22 Input-side DC bias circuit
23 Support-side DC bias circuit
24 Output-side DC bias circuit
25 Input-side facing portion
26 Output-side facing portion
27 First input-side mediation layer
28 Second input-side mediation layer
29 First support-side mediation layer
30 Second support-side mediation layer
31 First output-side mediation layer
32 Second output-side mediation layer

The invention claimed is:

1. An MEMS resonator comprising:
a vibrator adapted to mechanically vibrate by being subjected to an electrostatic force;
a supporting portion adapted to support the vibrator so as to allow the vibrator to vibrate; and
at least a single electrode having a surface which faces the vibrator with a gap interposed therebetween;
one of the supporting portion and the electrode being an input electrode, and the other one of the supporting portion and the electrode being an output electrode,
the vibrator being adapted to be excited by an electrostatic force induced by an AC signal applied to the input electrode through an input terminal connected to the input electrode, so that an electric current induced by the vibration of the vibrator is outputted from the output electrode through an output terminal connected to the output electrode,
wherein there is formed a junction interface having at least one of a pn junction, a pp junction, an nn junction, a metal-n junction, and a metal-p junction, in an electric-current path between the input terminal and the input electrode or in an electric-current path between the output electrode and the output terminal, and
there is provided a DC bias circuit for continuously flowing a DC current through the junction interface.

2. The MEMS resonator according to claim 1, comprising a first intermediate layer placed on a surface of the input electrode,
wherein
the junction interface is formed between the input electrode and the first intermediate layer,
the input terminal is connected to the input electrode through the first intermediate layer,
the DC bias circuit includes
a first impedance device which is connected at its one end to one of a DC power supply and a common electrode and, further, is connected to the first intermediate layer at the other end thereof, and
a second impedance device which is connected at its one end to the surface of the input electrode in an area thereof other than the area in which the first intermediate layer is formed and, further, is connected at its other end to the other one of the DC power supply and the common electrode,
the first impedance device has an inductor or a resistance,
the second impedance device has an inductor or a resistance, and
one of the first impedance device and the second impedance device has a resistance.

3. The MEMS resonator according to claim 2, comprising a second intermediate layer which is placed on the surface of the input electrode and is spaced apart from the first intermediate layer, wherein
the second impedance device is connected to the input electrode through the second intermediate layer.

4. The MEMS resonator according to claim 3, wherein the second intermediate layer is formed to include a metal layer.

5. The MEMS resonator according to claim 3, wherein the first intermediate layer is formed to include a metal layer and a mediation layer which are laminated.

6. The MEMS resonator according to claim 2, wherein the first impedance device or the second impedance device is made to have an impedance value set such that an electric current of an AC signal inputted to the input terminal is prevented from flowing through the DC power supply or the common electrode.

7. The MEMS resonator according to claim 2, wherein the first intermediate layer is formed to include a metal layer.

8. The MEMS resonator according to claim 2, wherein the first intermediate layer is formed to include a metal layer and a mediation layer which are laminated.

9. The MEMS resonator according to claim 1, comprising a first intermediate layer placed on a surface of the output electrode,
wherein
the junction interface is formed between the output electrode and the first intermediate layer,
the output terminal is connected to the output electrode through the first intermediate layer,
the DC bias circuit includes
a first impedance device which is connected at its one end to one of a DC power supply and a common electrode and, further, is connected to the first intermediate layer at the other end thereof, and
a second impedance device which is connected at its one end to the surface of the output electrode in an area thereof other than the area in which the first intermediate layer is formed and, further, is connected at its other end to the other one of the DC power supply and the common electrode,
the first impedance device has an inductor or a resistance,
the second impedance device has an inductor or a resistance, and
one of the first impedance device and the second impedance device has a resistance.

10. The MEMS resonator according to claim 9, comprising a second intermediate layer which is placed on the surface of the output electrode and is spaced apart from the first intermediate layer, wherein
the second impedance device is connected to the output electrode through the second intermediate layer.

11. The MEMS resonator according to claim 10, wherein the second intermediate layer is formed to include a metal layer.

12. The MEMS resonator according to claim 10, wherein the first intermediate layer is formed to include a metal layer and a mediation layer which are laminated.

13. The MEMS resonator according to claim 9, wherein the first impedance device or the second impedance device is made to have an impedance value set such that an electric current of an AC signal inputted to the input terminal is prevented from flowing through the DC power supply or the common electrode.

14. The MEMS resonator according to claim 9, wherein the first intermediate layer is formed to include a metal layer.

15. The MEMS resonator according to claim 9, wherein the first intermediate layer is formed to include a metal layer and a mediation layer which are laminated.

16. An MEMS resonator comprising:
a vibrator adapted to mechanically vibrate by being subjected to an electrostatic force;
a supporting portion adapted to support the vibrator in such a way as to allow the vibrator to vibrate; and
at least two electrodes having a surface which faces the vibrator with a gap interposed therebetween;
one of the at least two electrodes being an input electrode, and the other one of the at least two electrodes being an output electrode,
the vibrator being adapted to be excited by an electrostatic force induced by an AC signal applied to the input electrode through an input terminal connected to the input electrode, so that an electric current induced by the vibration of the vibrator is outputted from the output electrode through an output terminal connected to the output electrode,
wherein a bias terminal is connected to the supporting portion which is formed integrally with the vibrator, there is formed a junction interface having at least one of a pn junction, a pp junction, an nn junction, a metal-n junction, and a metal-p junction, in an electric-current path between the bias terminal and the supporting portion, and
there is provided a DC bias circuit for continuously flowing a DC current through the junction interface.

17. The MEMS resonator according to claim 16, comprising
a first intermediate layer placed on a surface of the supporting portion,
wherein
the junction interface is formed between the supporting portion and the first intermediate layer,
the bias terminal is connected to the supporting portion through the first intermediate layer, through first wiring,
the DC bias circuit includes
second wiring which connects a common electrode to the surface of the supporting portion in an area thereof other than the area in which the first intermediate layer is formed, and
one of the first wiring and the second wiring includes a resistance device, halfway therethrough.

18. The MEMS resonator according to claim 17, comprising a second intermediate layer which is placed on a surface of the second supporting portion and is spaced apart from the first intermediate layer with the vibrator interposed therebetween, wherein
the second wiring connects the second supporting portion to the common electrode through the second intermediate layer.

19. The MEMS resonator according to claim 16, wherein
the supporting portion includes a first supporting portion and a second supporting portion which are adapted to support opposite ends of the vibrator,
there is provided a first intermediate layer which is placed on a surface of the first supporting portion,
the junction interface is formed between the first supporting portion and the first intermediate layer,
the bias terminal is connected to the first supporting portion through the first intermediate layer, through first wiring, and
the DC bias circuit includes second wiring which connects a common electrode to the second supporting portion.

20. The MEMS resonator according to claim 19, comprising a second intermediate layer which is placed on a surface of the second supporting portion and is spaced apart from the first intermediate layer with the vibrator interposed therebetween, wherein
the second wiring connects the second supporting portion to the common electrode through the second intermediate layer.

* * * * *